(12) United States Patent
Koike et al.

(10) Patent No.: US 6,882,539 B2
(45) Date of Patent: Apr. 19, 2005

(54) ELECTRONIC CIRCUIT BOARD CASE AND METHOD OF PRODUCING ELECTRONIC CIRCUIT UNIT

(75) Inventors: Tatsuo Koike, Kakuda (JP); Mitsuhiro Ito, Takanezawa-machi (JP)

(73) Assignee: Keihin Corporation, Tokyo (JP)

( * ) Notice: Subject to any disclaimer, the term of this patent is extended or adjusted under 35 U.S.C. 154(b) by 0 days.

(21) Appl. No.: 10/358,201

(22) Filed: Feb. 5, 2003

(65) Prior Publication Data

US 2003/0147217 A1 Aug. 7, 2003

(30) Foreign Application Priority Data

Feb. 6, 2002 (JP) ........................................ 2002-028964

(51) Int. Cl.[7] .............................................. H05K 5/06
(52) U.S. Cl. ........................ 361/752; 361/797; 361/800
(58) Field of Search ................................ 361/752, 797, 361/724, 714, 800, 796, 801

(56) References Cited

U.S. PATENT DOCUMENTS 4,392,701 A * 7/1983 Weidler .................... 439/76.1
4,855,873 A * 8/1989 Bhargava et al. ........... 361/818
6,249,442 B1 * 6/2001 Watanabe .................. 361/801

FOREIGN PATENT DOCUMENTS

| JP | 62-213197 | 9/1987 |
| JP | 4-324992 | 11/1992 |

* cited by examiner

*Primary Examiner*—Kamand Cuneo
*Assistant Examiner*—Hung S. Bui
(74) *Attorney, Agent, or Firm*—Westerman, Hattori, Daniels & Adrian, LLP

(57) ABSTRACT

In a case for housing an electronic circuit board, the opening edge of the case body is formed with a prescribed distance below the board mounting surface. The board is fastened on the mount of the case body with the fastening means. The case body is then inverted and is placed over a rising coating bath, and then the coating bath is raised close to the opening edge such that the board is dipped in the coating liquid and is coated. By this, application of the coating liquid to prescribed regions constituting coating-prohibited regions of the case body can be prevented. Cost can therefore be kept down and complication of the processing steps prevented because no masking of the case body is necessary. Moreover, the reliability of the electronic circuit unit can be enhanced and the need for a jib is eliminated. This helps to avoid complication of the fabrication process and makes another contribution to cost control.

5 Claims, 22 Drawing Sheets

FIG. 10

|  | MEASURED STRESS/ PERMISSIBLE MAXIMUM STRESS ×100[%] |
|---|---|
| IN FASTENING BOARD | 8.6 |
| AFTER BOARD ATTACHED | 47.4 |
| VIBRATION TEST | 0.23 |

ELECTRONIC CIRCUIT BOARD CASE AND METHOD OF PRODUCING ELECTRONIC CIRCUIT UNIT

BACKGROUND OF THE INVENTION

1. Field of the Invention

This invention relates to an electronic circuit board case, particularly to a case for housing an electronic circuit board and a method of producing an electronic circuit unit, more particularly to a case for housing an electronic circuit board applied with a coating and a method of producing or manufacturing an electronic circuit unit utilizing the electronic circuit board.

2. Description of the Related Art

Conventional electronic circuit units, such as the one taught by Japanese Laid-Open Patent Application No. 4(1992)-324992 ('992), have been made more compact by vertically stacking an electronic circuit board and power transistors to reduce the footprint of the case housing them. An electronic circuit unit of this type is fabricated by screw-fastening power transistors, passing the power transistor leads through perforations in the electronic circuit board, mounting the electronic circuit board in the case, and finally soldering the power transistor leads.

After electronic components have been mounted on the electronic circuit board, the insulation property of the electronic circuit board is increased by coating the entire electronic circuit board (the side with electronic components and the reverse side) with an insulative paint. As taught by Japanese Laid-Open Patent Application No. 62(1987)-213197 ('197), the coating is conducted simply by dipping the electronic circuit board into coating liquid in a bath. Assembly of the electronic circuit unit is completed by accommodating the coated electronic circuit board in the case.

The electronic circuit unit of the structure set out in '992 requires that the electronic components be soldered after the electronic circuit board has been mounted in the case. Coating of the board is therefore carried out with the electronic circuit board mounted in the case. When the electronic circuit board is coated by dipping it in coating liquid as in the method of '197, therefore, certain coating-prohibited regions of the case (including the edge of the opening contacted by the cover) have to be masked. In addition, when the electronic circuit unit is equipped with a connector, for example, masking is required to prevent the coating liquid from being applied to the connector, particularly the connector pins for connection with external devices. The need for such coating complicates the fabrication process.

In the electronic circuit unit of the structure taught by '992, the electronic circuit board is enclosed by the case. As this makes application of the coating liquid to the heat sink side of the electronic circuit board (the reverse side) difficult, it tends to lower the reliability of the insulation. This electronic circuit unit therefore has room for improvement.

While coating can also be done by spraying, this method also requires troublesome masking.

Regardless of whether the dipping method or the spraying method is adopted, a jig is required for holding the electronic circuit board or the case. This increases cost and complicates the fabrication work.

SUMMARY OF THE INVENTION

An object of the present invention is therefore is to overcome the aforesaid problem by providing a case for housing an electronic circuit board and a method of producing an electronic circuit unit that preclude complication of fabrication work by eliminating the need for either masking or a jig at the time of electronic circuit board coating, hold down cost, and improve reliability by enabling coating of the entire surface of the electronic circuit board with coating after the electronic circuit board has been mounted in the case.

In order to achieve the foregoing object, this invention in a first aspect provides a case for housing an electronic circuit board, including; a case body formed with an opening at least at an upper surface for accommodating the electronic circuit board and with a mount having a mounting surface for mounting the electronic circuit board; and fastening means for fastening the electronic circuit board on the mount, wherein the improvement comprises: the opening is configured such that whose edge is formed a prescribed distance below the mounting surface.

More specifically, the case for housing an electronic circuit board has a case body formed with a mount having a mounting surface for mounting at least an electronic circuit board; fastening means for fastening the electronic circuit board on the mount; and a cover attachable to the case body with a lower edge surface of a side wall of the cover in contact with an upper edge surface of a side wall of the case body, the case for housing the electronic circuit board being adapted to house the electronic circuit board in an internal space formed between the case body and the cover to be fastened on the mount by the fastening means, wherein the upper edge surface of a side wall of the case body (i.e., the edge defining the opening) is formed at a prescribed distance below a mounting surface of the mount and the side wall of the cover is extended the prescribed vertical distance toward the lower edge surface of the side wall, thereby securing the internal space for housing electronic circuit board.

The edge defining the opening formed at the upper surface of the case body is formed at a prescribed distance below the mounting surface for the electronic circuit board. In other words, the mounting surface for the electronic circuit board is located above the edge of the opening. After the electronic circuit board has been attached to the case body, it can be inverted and dipped in coating liquid in the attached condition. By this, application of the coating liquid to prescribed regions constituting coating-prohibited regions (not including the mount) of the case body can be prevented. Cost can therefore be kept down and complication of the processing steps prevented because no masking of the case body is necessary.

Since full coating (coating of all surfaces) is possible with the electronic circuit board attached to the case, moreover, the reliability of the electronic circuit unit can be enhanced. In addition the fact that coating can be conducted with the electronic circuit board attached to the case body eliminates the need for a jib. This helps to avoid complication of the fabrication process and makes another contribution to cost control.

In a second aspect, this invention provides a case for housing an electronic circuit board, wherein the prescribed distance is determined to a height such that when the electronic circuit board is fixed on the mount of the case body is inverted and dipped into the coating liquid for full coating, the coating liquid is not applied to a prescribed region of the case body.

The prescribed distance is set to one such that when the electronic circuit board fixed on the mount of the case body is fully coated, the coating liquid is not applied to the prescribed regions constituting coating-prohibited regions of the case body. In other words, the mounting surface is formed so that all surfaces of the electronic circuit board are higher than the edge of the case body opening so that full coating of the electronic circuit board with the coating liquid is possible even if the coating is conducted with the electronic circuit board fastened in the case. The reliability of the electronic circuit unit can therefore be effectively improved.

In a third aspect, this invention provides a case for housing an electronic circuit board, wherein a connecter for connection with external devices is integrally formed with the case body to constitute a portion of the prescribed region not applied with the coating liquid.

Since a connecter for connection with external devices is integrally formed with the case body to constitute one of the prescribed regions not applied with the coating liquid, application of coating liquid to the connector can be prevented. In addition, the connector can be utilized as a hold to be gripped by a holding means explained later. As this eliminates the need for a jig, complication of the fabrication is prevented and cost held down.

In a fourth aspect, this invention provides a case for housing an electronic circuit board, wherein the edge of the opening is formed such that two opposed sides of the opening edge form a prescribed angle relative to the mounting surface.

The edge of the opening is formed such that two opposed sides of the opening edge form a prescribed angle relative to the mounting surface. In other words, the opening edge is formed to slant with respect to the mounting surface. Therefore, even if flow of the coating liquid to the periphery of the electronic circuit board should be facilitated by dipping the board into the coating liquid as inclined by a prescribed angle with respect to the coating liquid surface, no coating liquid will be applied to the opening edge because the opening edge is maintained parallel to the coating liquid surface. Full coating of the electronic circuit board with the coating liquid can therefore be reliably achieved while preventing application of the coating liquid to the case body.

In a fifth aspect, this invention provides a method of producing an electronic circuit unit including the case for housing an electronic circuit board according to any of the first to fourth aspects comprising the steps of: fastening at least the electronic circuit board on the mount of the case body with the fastening means; inverting the case body in which the electronic circuit board is fixed; placing the inverted case body over a rising coating bath line; and raising the coating bath close to the edge of the opening such that the electronic circuit board is dipped in the coating liquid.

As will be understood from the first to fourth aspects of the invention explained above, the case body is constituted so that the mounting surface for the electronic circuit board is higher than the opening edge of the case body. From this it follows that application of coating liquid to the prescribed regions (the coating-prohibited regions; not including the mount) of the case body can be prevented by the invention method of manufacturing the electronic circuit unit in which at least the electronic circuit board is fastened on the mount of the case body with the fastening means, the case body in which the electronic circuit board is fixed is inverted, the inverted case body is placed over a rising coating bath line, and the coating bath is raised to near the edge of the opening to dip the electronic circuit board in the coating liquid. Cost can therefore be kept down and complication of the processing steps prevented because no masking of the case body is necessary.

Since full coating can be conducted with the electronic circuit board fastened to the case, moreover, the reliability of the electronic circuit unit can be upgraded. In addition, the fact that the coating can be conducted with the electronic circuit board attached to the case body eliminates the need for a jig. As a result, complication of the fabrication process is prevented and cost held down still more effectively.

In a sixth aspect, this invention provides a method of producing an electronic circuit unit including the case for housing an electronic circuit board according to the fourth aspect comprising the steps of: fastening at least the electronic circuit board on the mount of the case body with the fastening means; inverting the case body in which the electronic circuit board is fixed; placing the inverted case body over a rising coating bath line with the connector held by an angularly adjustable holding means; adjusting an angle of the holding means to incline the electronic circuit board at the prescribed angle with respect to the coating liquid surface; raising the coating bath close to the edge of the opening such that the electronic circuit board is dipped in the coating liquid; adjusting the angle of the holding means such that the electronic circuit board is positioned horizontal with respect to the coating liquid surface; and adjusting the angle of the holding means such that the electronic circuit board is inclined at the prescribed angle with respect to the coating liquid, while lowering the coating bath.

This method makes it possible to eliminate the need for a jig because after the electronic circuit board has been fastened to the case body, the connector can be held by the holding means, i.e. a chuck. Since the angle of the holding means is adjusted to incline the electronic circuit board at the prescribed angle with respect to the coating surface and the coating bath is raised to dip the electronic circuit board in the coating liquid as held in this state, flow of the coating liquid to the periphery of the electronic circuit board is promoted. No masking work is required for this operation since application of coating liquid to the opening edge is prevented because the edge of the opening is maintained parallel to the coating liquid surface owing to the fact that, as explained above, the edge of the case body opening is inclined at a prescribed angle with respect to the mounting surface.

When the coating bath has been raised to near the edge of the case body opening, the angle of the holding means is adjusted to make the electronic circuit board horizontal (parallel) to the coating liquid surface. The coating liquid can therefore be run across the entire surface area of the electronic circuit board. Then, during lowering of the coating bath, the angle of the holding means is adjusted to again incline the electronic circuit board at the prescribed angle with respect to the coating liquid surface. As this causes excess coating liquid to run off (fall back into the coating bath), the electronic circuit board can be fully covered with a coating of uniform thickness. Thus, the method of producing an electronic circuit unit according to the sixth aspect prevents complication of the fabrication and holds down cost still more effectively. It also upgrades the reliability of the electronic circuit unit.

BRIEF DESCRIPTION OF THE DRAWINGS

The objects and advantages of the invention will be made apparent with reference to the following descriptions and drawings, in which:

FIG. 10 is a table showing stress acting on the board fastening catches when the board shown in FIG. 2 is fastened;

FIG. 19 is a side view showing the electronic circuit unit in steps (S1, 3) of the flow chart shown in FIG. 18;

DETAILED DESCRIPTION OF THE PREFERRED EMBODIMENTS

A case for housing an electronic circuit board according to an embodiment of this invention and a method of producing an electronic circuit unit comprising the case and an electronic circuit board will now be explained with reference to the attached drawings.

Figure 1:
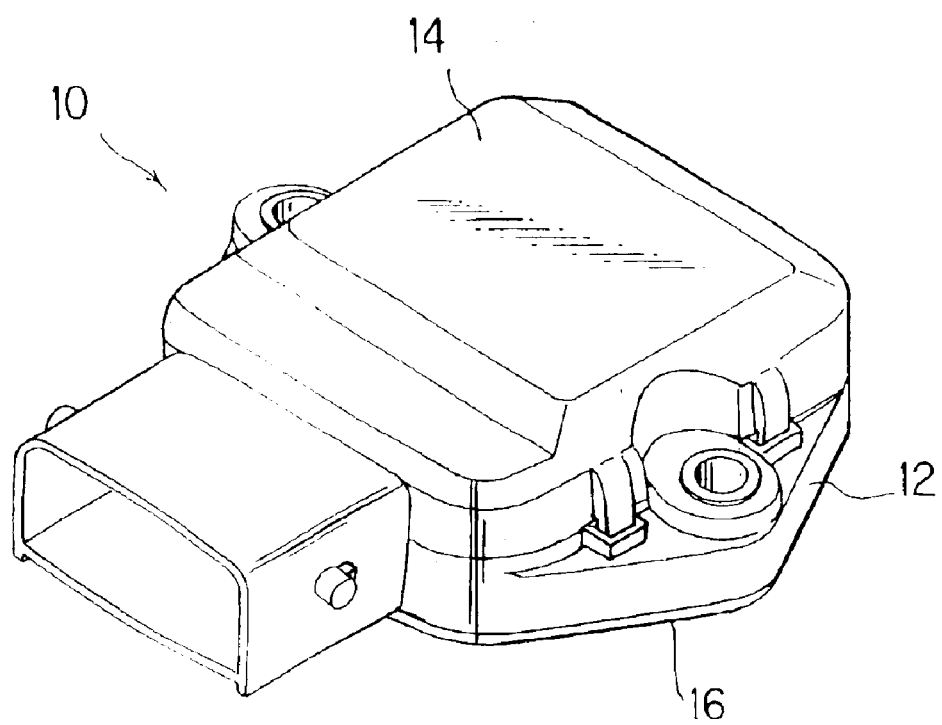
FIG. 1 is a perspective view showing a case for housing an electronic circuit board equipped with a fastening member according to an embodiment of this invention.

FIG. 1 is a perspective view of the case for housing an electronic circuit board according to this embodiment.

As shown in the drawing, the case for housing an electronic circuit board of this embodiment (hereinafter referred to as "case 10") is composed of a case body 12 made of resin (PBT), a cover 14 also made of resin (PBT), and a heat sink 16 made of a metal having high heat conductivity (aluminum).

Figure 2:
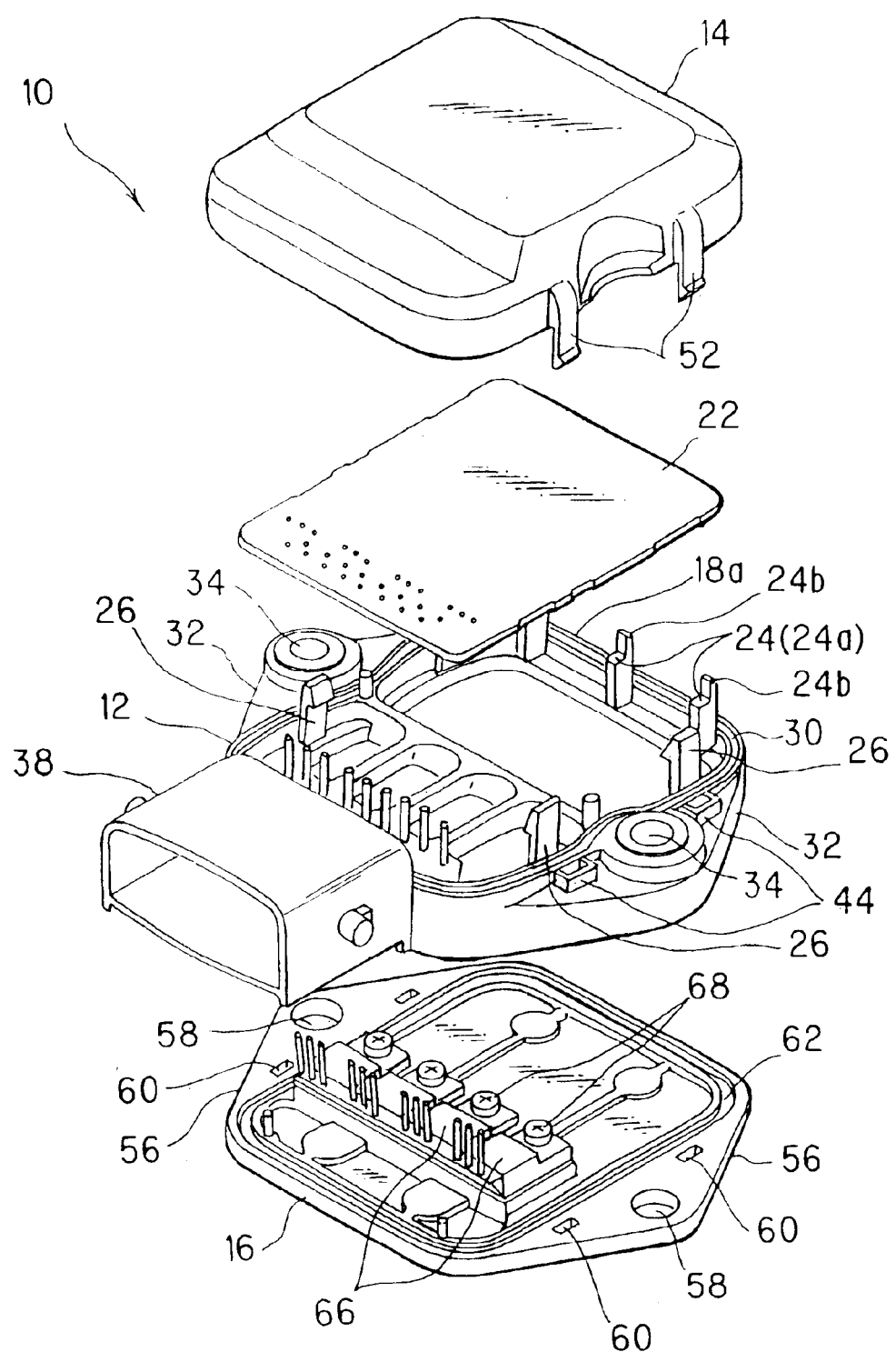
FIG. 2 is a perspective view showing the individual elements of the case shown in FIG. 1.
Figure 3:
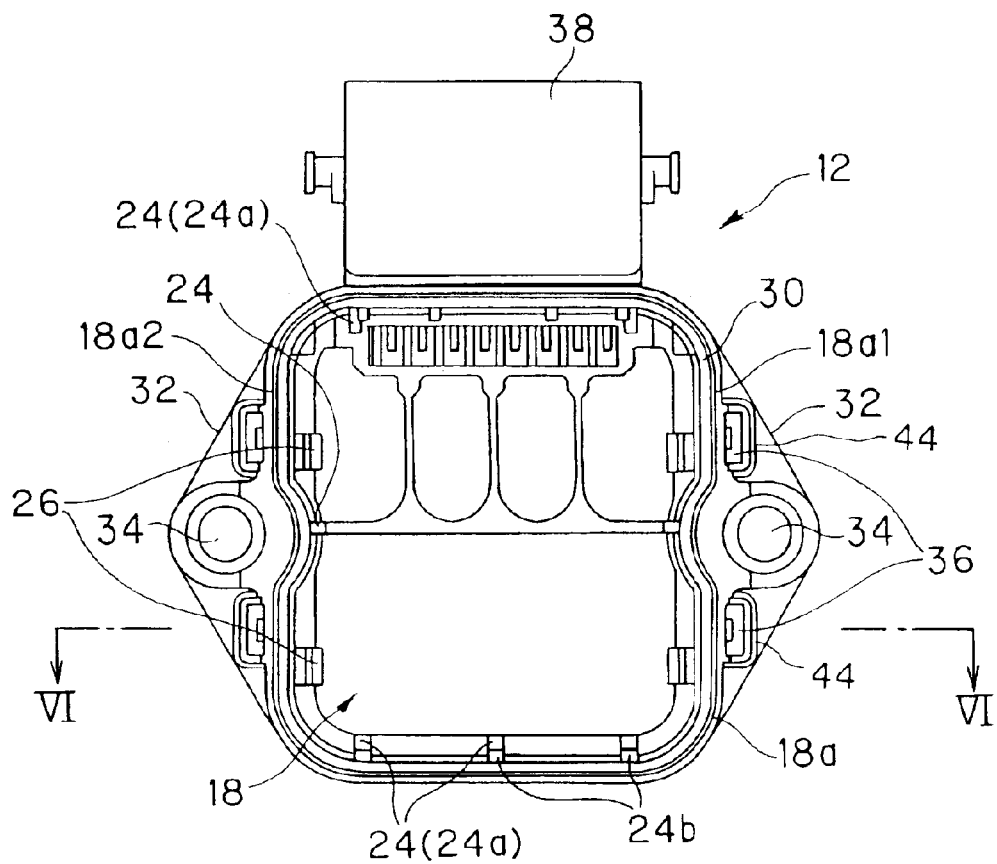
FIG. 3 is a top view of the case body of the case shown in FIG. 1.
Figure 4:
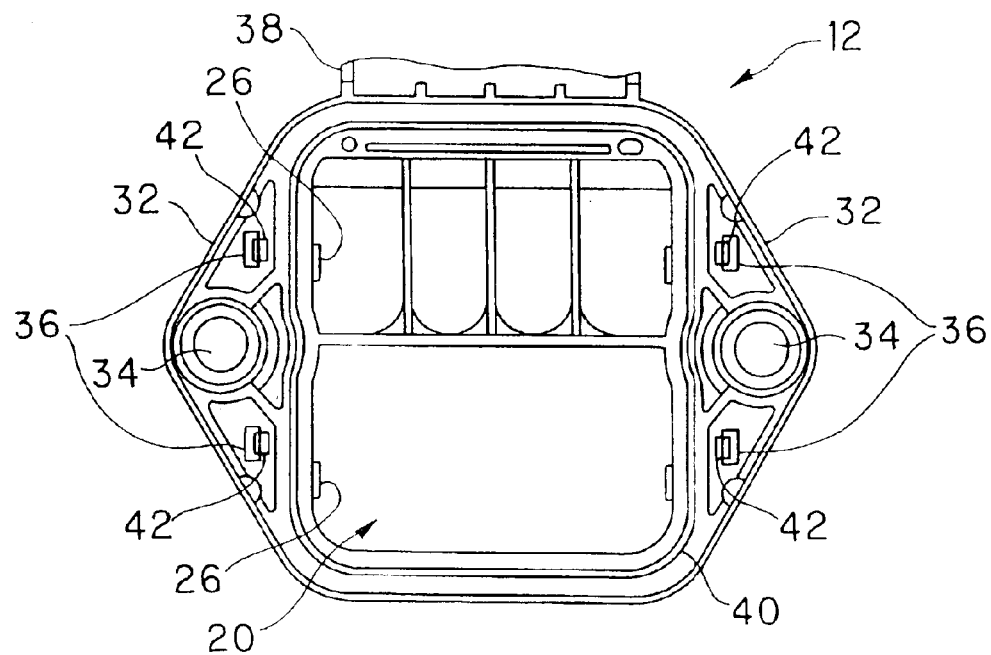
FIG. 4 is a bottom view of the case body of the case shown in FIG. 1.
Figure 5:
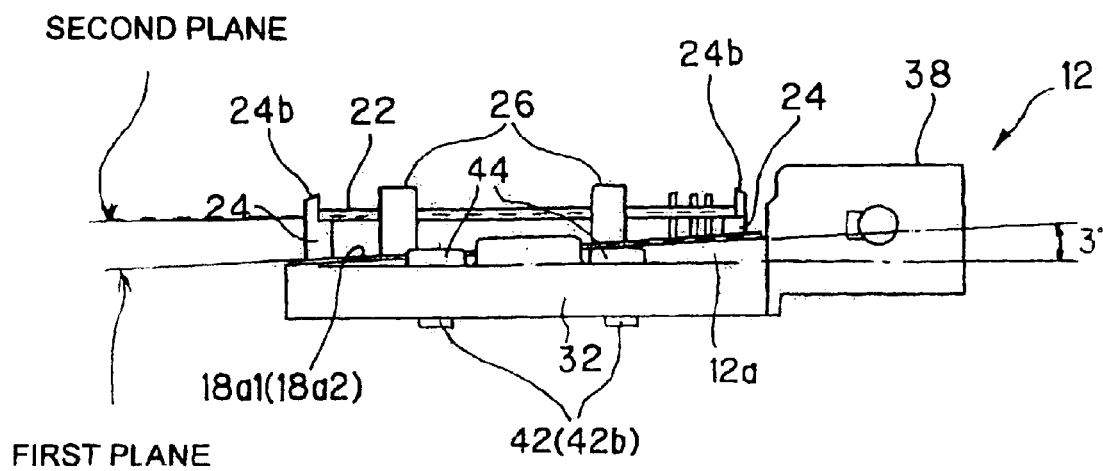
FIG. 5 is side view of the case body of the case shown in FIG. 1.
Figure 6:
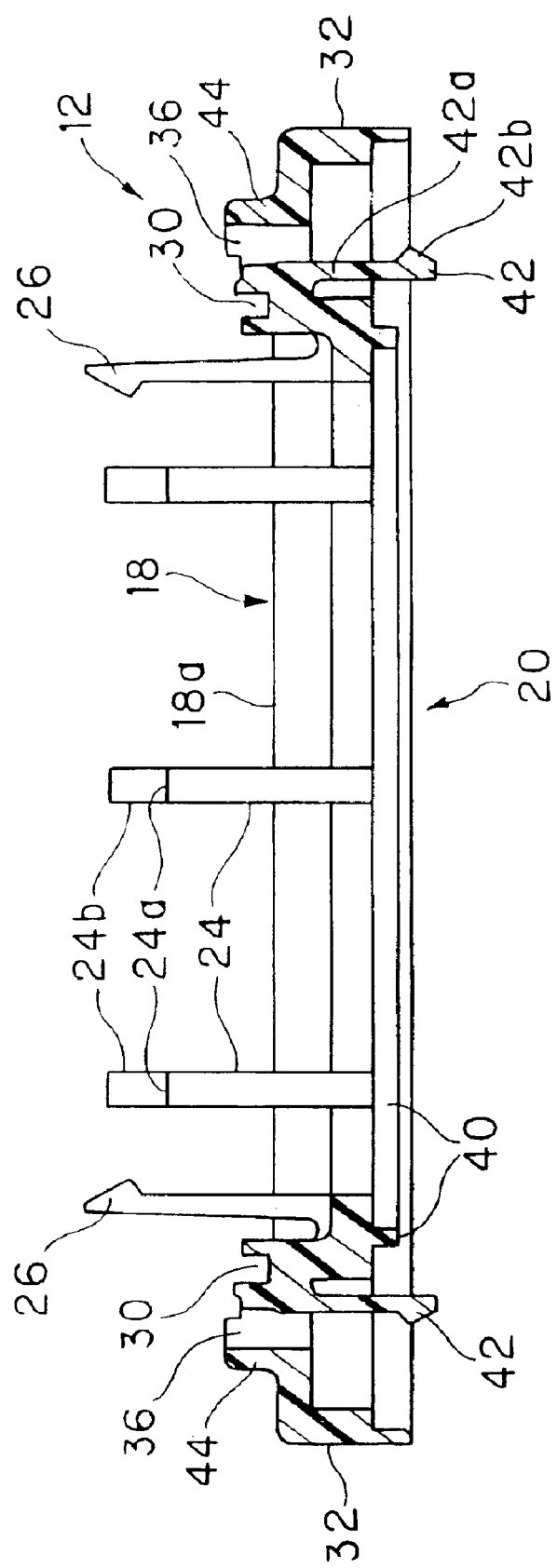
FIG. 6 is an enlarged sectional view taken along line VI—VI in FIG. 3.

FIG. 2 is a perspective view showing the individual elements of the case 10 shown in FIG. 1. FIG. 3 is a top view of the case body 12 and FIG. 4 is a bottom view thereof. (Part of a connector explained later has been omitted from these figures.) FIG. 5 is side view showing an electronic circuit board in its housed state. FIG. 6 is a sectional view taken along line VI—VI in FIG. 3. The case body 12 will now be explained with reference to FIGS. 2 to 6.

The case body 12 is open over nearly the entire area of its upper surface and lower surface. The opening on the upper surface side will be called "first opening 18" and that on the lower surface side will be called "second opening 20." The case body 12 houses at its interior an electronic circuit board 22 inserted through the first opening 18. (The electronic components mounted on the board 22 are omitted in the drawing.)

The case body 12 encloses an internal space of generally rectangular shape as viewed from the top. A plurality (6) ribs 24 are formed at appropriate locations on the internal space side (inner face) of a side wall 12a. As the cover 14 is also formed with ribs as explained later, the ribs formed on the case body 12 will be called "first ribs." The upper end surfaces 24a of the first ribs 24 collectively serve as a mounting surface for mounting the board 22. First stops 24b for locating the board 22 are formed at the tops of the upper end surfaces 24a toward the outer side of the case.

The characterizing feature here is that the upper end surfaces 24a are formed upward of the opening edge 18a defining the first opening 18 by a prescribed height (vertical distance). In other words, the opening edge 18a, i.e., the upper end of the side wall 12a of the case body 12, is formed a prescribed vertical distance toward the bottom surface side from the upper end surfaces 24a for mounting the board 22. As a result, the board 22 can be fixed to the upper end surfaces 24a (by board fastening catches explained later), the case body 12 as a whole be turned upside down (inverted), and the whole surface of the board 22 be coated by dipping in a coating liquid. Reliability is therefore not degraded in the point of insulation property and the like.

In addition, it is possible to prevent application of the coating liquid to prescribed regions constituting coating-prohibited regions of the case body 12, specifically the opening edge 18a. This reduces cost by eliminating the need for case body masking work and prevents the working process from becoming complicated.

Since coating can be carried out with the board 22 fixed to the case body 12, moreover, no jig is required. This further reduces process complexity and cost.

In order to ensure that the coating liquid does not adhere to the opening edge 18a, the aforesaid prescribed vertical distance is set to an appropriate value taking into account splashing of the coating liquid when the board 22 is dipped into the coating liquid.

A plurality of board fastening catches (fastening members) 26 for fastening the board 22 are also formed on the inner wall of the case body 12. Specifically, four catches are formed, two each on opposing sides of the inner wall.

Figure 7:
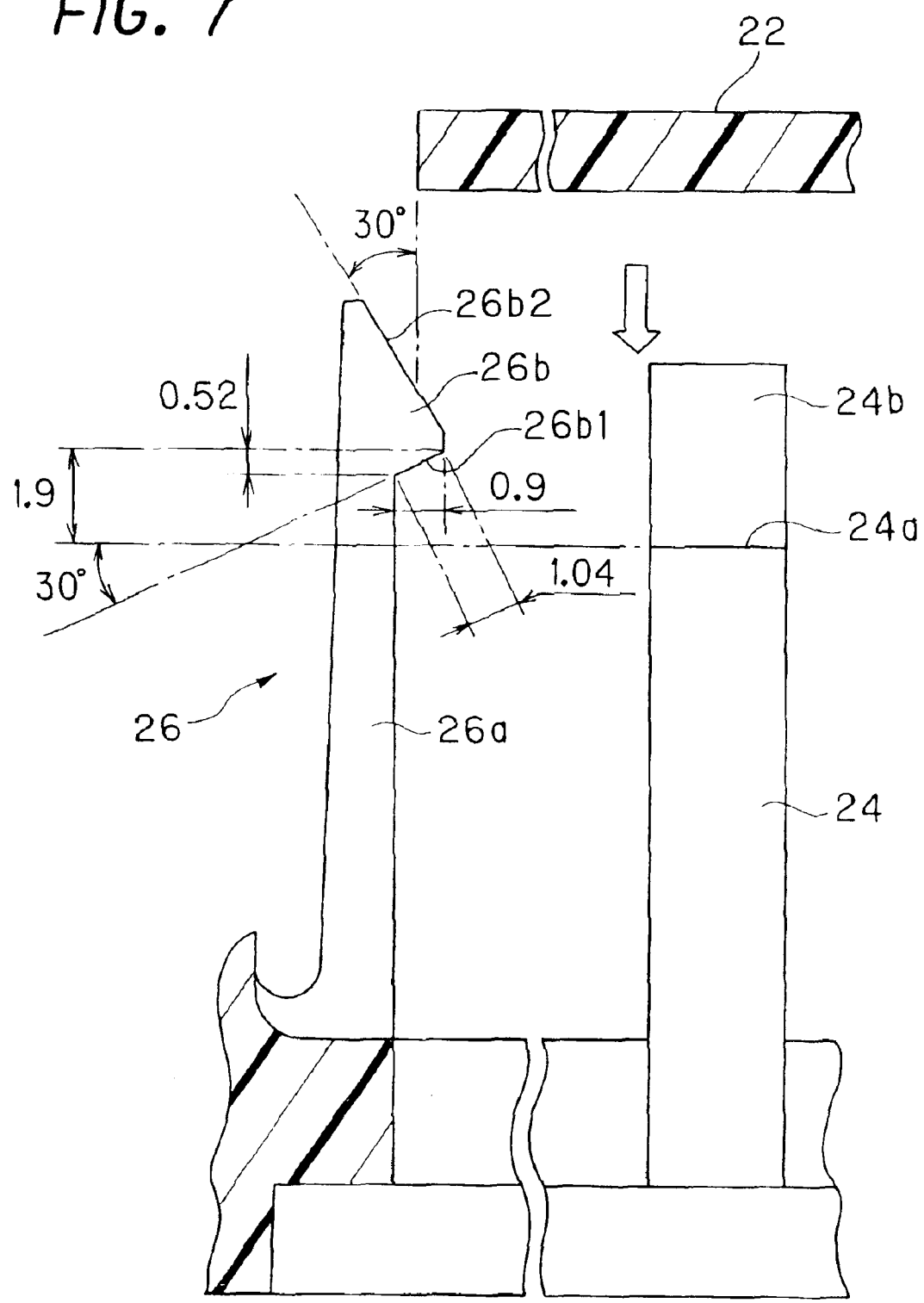
FIG. 7 is a partial enlargement of FIG. 6 for explaining a board fastening catch (fastening member)

The board fastening catches 26 are formed as shown in FIG. 7. FIG. 7 is an enlarged view of a board fastening catch 26.

As illustrated, the board fastening catch 26 comprises an elastically deformable leg 26a and a projection 26b continuous with the leg 26a and projecting toward the board 22, i.e., in the direction of the internal space of the case body 12. The projection 26b is formed at a location upwardly apart from the upper end surface 24a on which the board 22 is mounted by approximately the thickness of the board 22.

The surface that the board 22 contacts when fastened, hereinafter called the "board contact surface 26b1," is tapered toward the internal space side to form an angle of 30 degrees with the upper end surface 24a. The surface 26b2 contacted by the board 22 when it is inserted is tapered to form an angle of 30 degrees with the direction of board 22 insertion so as to facilitate the insertion.

As shown in the drawing, the lateral width of the board contact surface 26b1 is 0.9 mm and its vertical width (height) is 0.52 mm. Since, as explained above, the angle relative to the upper end surface 24a, i.e., relative to horizontal, is 30 degrees, the substantial length of the board contact surface 26b1 is 1.04 mm. The maximum distance in the vertical direction between the upper end surface 24a and the board contact surface 26b1 is 1.9 mm (the minimum distance is 1.9−0.52=1.38 mm), and the thickness of the board 22 is 1.6 mm.

Figure 8:
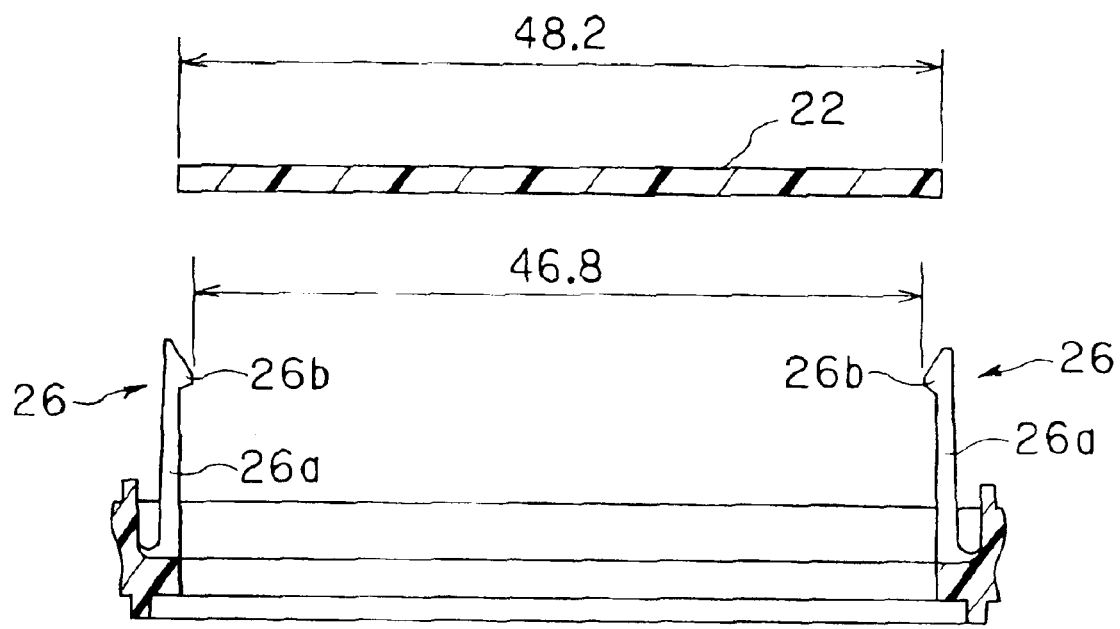
FIG. 8 is a simplified representation of FIG. 6 for explaining the width of the board shown in FIG. 2 and the distance between board fastening catches.

FIG. 8 shows the distance between opposing board fastening catches 26 at the tips of their projections 26b, and also shows the width of board 22. As shown in the drawing, the distance between the tips of the opposing projections 26b are set smaller than the width of the board 22.

Figure 9:
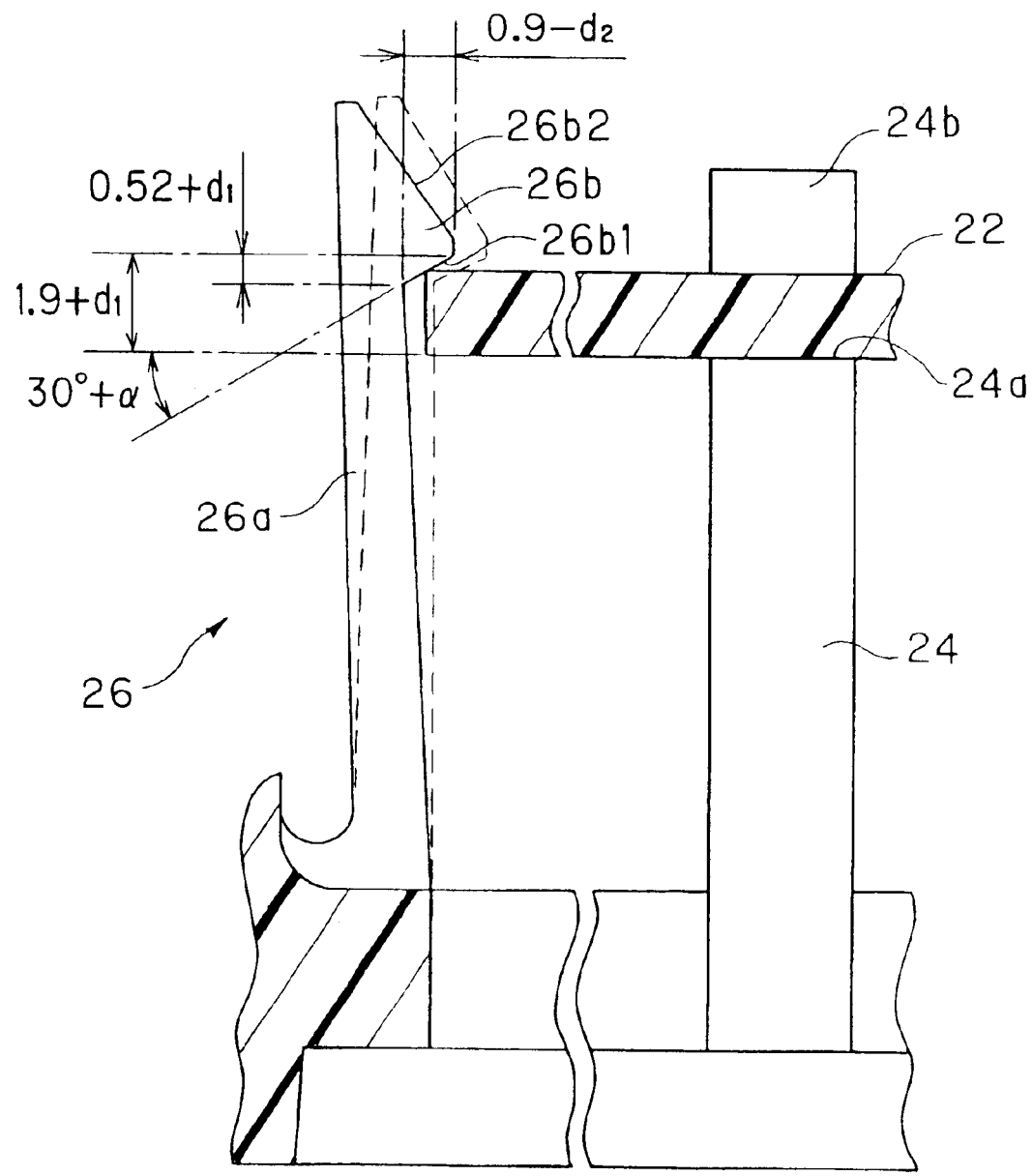
FIG. 9 is an explanatory diagram similar to FIG. 7 showing the fastened state of the board shown in FIG. 1.

FIG. 9 is a diagram for explaining the state of the board fastening catches 26 when the board 22 is fastened. As illustrated, the board 22 is fastened in a prescribed location by clamping it between the upper end surfaces 24a constituting the mounting surface and the board contact surfaces 26b1 (only one of each shown in FIG. 9). Therefore, so long as the width and thickness of the board 22 can fit within the range of the lateral width and vertical width of the board contact surface 26b1, the board 22 can be clamped between the upper end surfaces 24a and the board contact surfaces 26b1 to achieve fastening at the prescribed position. The board contact surface 26b1 and the board 22 contact tangentially at a prescribed angle. In other words, the structure is such that the tangent between the board contact surface 26b1 and the board 22 can vary within the range of the board contact surface 26b1. Therefore, molding error of the board 22 and the board fastening catches 26, and volumetric variation caused by temperature change, are tolerable within the range of the lateral width and vertical width of the board contact surface 26b1. The force clamping the board 22 depends on the elasticity of the leg 26a.

The fastening of the board 22 on the upper end surfaces 24a elastically deforms the board fastening catches 26, more precisely the legs 26a. This changes the angle between the upper end surfaces 24a and the board contact surfaces 26b1. (The angle after the change, i.e., the angle between the board 22 and the board contact surface 26b1, is defined as 30 degrees+α degrees). Owing to this angle change, the lateral width and the vertical width of the board contact surface 26b1 changes and the maximum distance in the vertical direction between the upper end surface 24a and the board contact surface 26b1 also changes.

Specifically, the greater the elastic deformation of the leg 26a (i.e., the greater the angle between the upper end surface 24a and the board contact surface 26b1 becomes), the larger becomes the vertical width of the board contact surface 26b1 and the maximum distance between the board contact surface 26b1 and the upper end surface 24a (designated +d1), and the smaller becomes the lateral width of the board contact surface 26b1 (designated −d2).

Since $\sin\theta + \cos\theta$ becomes maximum when $\theta=45$ degrees, maximum molding error and volumetric variation are allowable when the dimensions of the different constituents are defined so that the angle between the upper end surface 24a and the board contact surface 26b1 is 45 degrees when the board 22 is mounted on the upper end surface 24a (i.e., so that α becomes 15 degrees). Otherwise, the angle after fastening can be appropriately set according to the stress applied to the board fastening catches 26 and the board 22.

Assume, for example, that the board 22 has the width of 48.2 mm and thickness of 1.6 mm set out above, Then, assuming a coefficient of thermal expansion of $14\times10^{-6}$ and a temperature variation range of $-40°$ C. to $120°$ C. ($\Delta T= 165°$ C.), it follows that Lateral change=48.2×(14×10$^{-6}$×165)=0.11 mm, Thickness change=1.6×(14×10$^{-6}$×165)=0.0037 mm.

The angle after fastening is therefore preferably set at 45 degrees or less to secure large a large lateral change allowance. Also in the case of use in an environment where large vertical vibration (stress) is applied, the angle after fastening is preferably set at 45 degrees or less so as to eliminate play by pressing the board 22 downward. The inventors conducted various tests taking the foregoing considerations into account. As a result they learned that when the case 10 of this embodiment is installed in the engine compartment of a vehicle—an environment marked by extreme temperature change and strong vertical vibration—it is possible by setting the value of α between 1 and 3 degrees (i.e., setting the angle after fastening between 31 and 33 degrees) to cope readily with the stress produced by volumetric variation owing to temperature change and by vibration and thus to prevent damage to the board fastening catches 26 and detachment of the board 22.

FIG. 10 shows measured values of the stress acting on the board fastening catches 26 when the board 22 is fastened in the case body 12 of this embodiment. In this figure, the term "permissible maximum stress" refers to tolerance with respect to instantaneous bending stress, and other maximum allowable stress refers to tolerance with respect to continuous stress (repeated stress). Stress after attachment is the value to be added to the stress produced by the vibration test.

It can be seen from FIG. 10 that the board fastening catch 26 of this embodiment had some leeway, relative to its strength characteristic, in the stress value that could actually be applied. This result, while of course also related to the dimensions of the board fastening catches 26, can be traced largely to the fact the stress acting on the board fastening catches 26 was resolved vertically and laterally owing to the adoption of a structure that resulted in a prescribed angle being formed between the board contact surface 26b1 and the upper end surfaces 24a after fastening of the board 22. From the fact that stress generated in the vibration test was small, moreover, it can be seen that the board 22 did not resonate owing to the vibration but was firmly immobilized by the board fastening catches 26.

Even if the board 22 should expand or contract in response to the ambient temperature environment, the board fastening catches 26, specifically the board contact surfaces 26b1, will follow these changes to keep the board 22 constantly fixed in place free of slack.

The explanation with reference to FIGS. 2 to 6 will be continued. An annular recession 30 is formed at the outer periphery of the first opening 18. Two flanges 32 of triangular shape as viewed from above are formed on the outside (outer face) of the side wall 12a of the case body 12. Each flange is formed with a bolt hole 34 for insertion of a bolt (not shown) and with two first engagement holes 36 that receive cover fastening catches (explained later) and engage their projections.

A connector 38 is formed integrally with the outer side face (outer wall) of the case body 12 so as to project from the side wall. This configuration ensures that the connector 38 is not applied with coating liquid at the time of coating. It further enables coating to be conducted without using a jig because the board 22 can be fixed over the line for conducting coating via the case body 12 by fastening the connector 38 to a chuck (holding means). While the connector 38 is formed integrally with the case body 12 in this embodiment, it only needs to be installed at a location where the foregoing purposes can be achieved and can, for example, be provided as a separate body fixed to the case body 12 by bolts or the like.

Two of the sides of the opening edge 18a defining the first opening, namely, the opposing sides 18a1 and 18a2, are inclined. Specifically, as best shown in FIG. 5, the sides 18a1 and 18a2 are formed to make a prescribed angle (e.g., 3 degrees) with respect to the board 22 when the board 22 is fastened to the upper end surfaces 24a. Therefore, when the board 22 is inclined within the coating liquid and the whole of the board 22 is immersed, no coating liquid is applied to the opening edge 18a. Although the prescribed angle is 3 degrees in this embodiment, it can be appropriately set taking into account the material (wettability) of the board 22 and the electronic components, and the viscosity of the coating liquid.

A first annular ridge 40 is formed at the outer periphery of the second opening 20 on the bottom side of the case body 12. In addition, heat sink fastening catches (fastening members) 42 for fastening the heat sink 16 are formed near the first engagement holes 36. Each heat sink fastening catch 42 is composed of an elastically deformable leg 42a and a projection 42b continuous therewith. It is formed with a surface 42b2 contacted by the heat sink 16 during fastening, a surface that tangentially contacts a prescribed region (explained later) of the heat sink 16 at a prescribed angle after it has been fastened (hereinafter called "heat sink contact surface 42b1"), and a horizontal surface 42b3 formed continuously with these surfaces and projecting in the horizontally outward direction of the case. The heat sink fastening catches 42 will be explained in more detail later.

The explanation of the upper surface side of the case body 12 will be continued. Covers 44 for covering the legs of cover fasting catches (explained later) are formed above the first engagement holes 36. This will be explained in more detail later.

Figure 11:
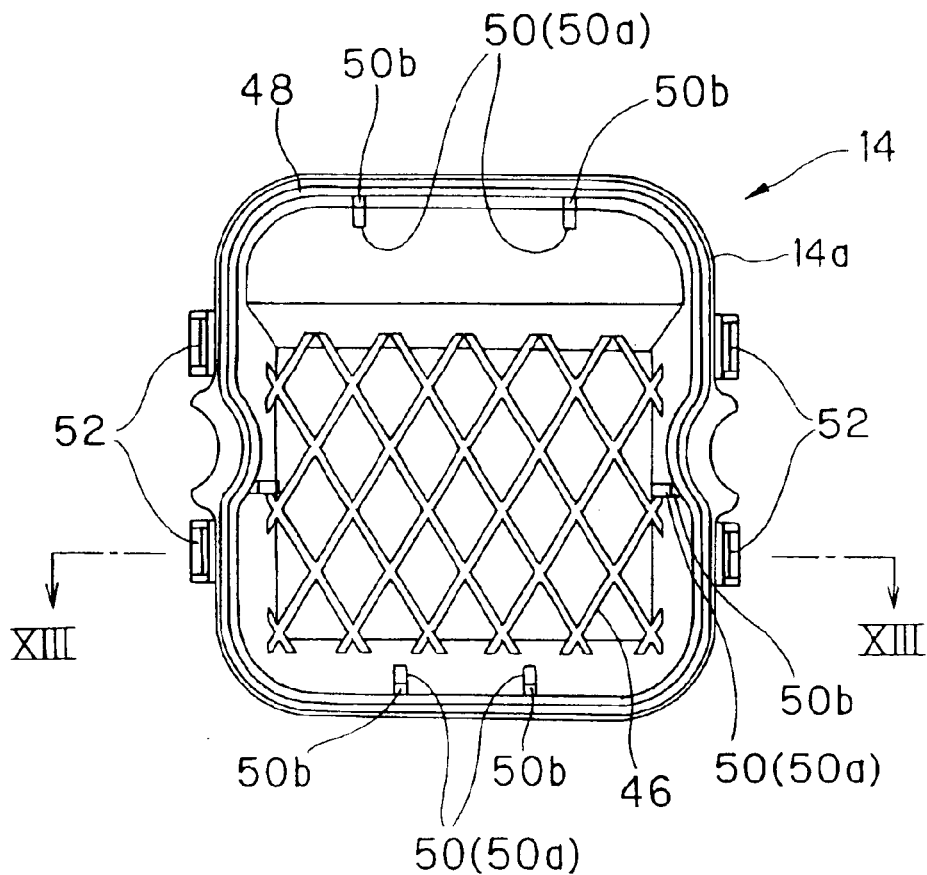
FIG. 11 is a bottom view of a cover of the case shown in FIG. 1.
Figure 12:
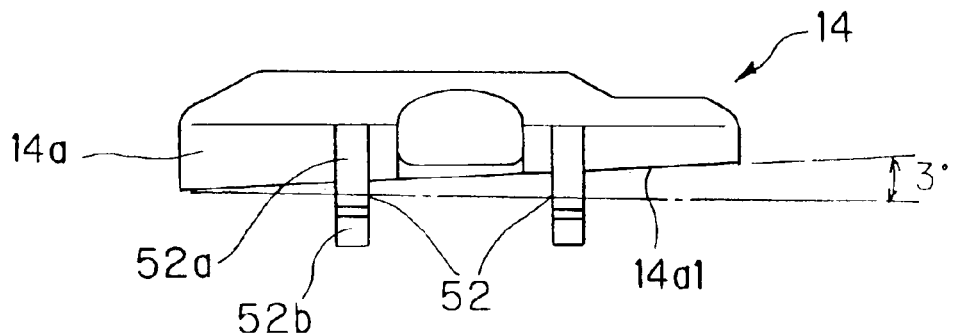
FIG. 12 is a side view of the cover of the case shown in FIG. 11
Figure 13:
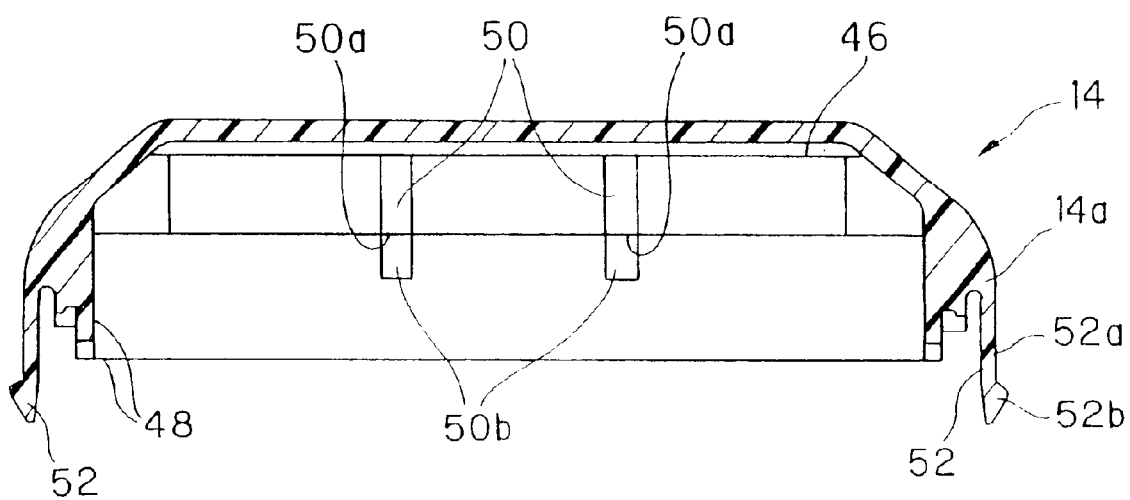
FIG. 13 is an enlarged sectional view taken along XIII—XIII in FIG. 11.

The cover 14 will now be explained. FIG. 11 is a bottom view of the cover 14 (view from the underside) and FIG. 12 is a side view thereof. FIG. 13 is an enlarged sectional view taken along XIII—XIII in FIG. 11. The explanation will be made with reference to FIGS. 2, 11 and 13.

The cover 14 is formed to have a rectangular shape as viewed from the bottom. The bottom surface of its side wall is congruent with the opening edge 18a that defines the first opening of the case body 12. Part of the upper surface protrudes upwardly to secure space for accommodating electronic components when the cover 14 is attached to the case body 12. Part of the upwardly protruding surface is reinforced with crosshatched ribs 46.

The aforesaid bottom surface of the side wall of the cover 14 is formed at a location corresponding to the first annular recession 30 of the case body 12 with a second annular ridge 48 for insertion in the first annular recession 30. Further, a plurality (4) of second ribs 50 are formed at appropriate locations on the internal space side (inner face) of the side wall.

The second ribs 50 are formed so that when the cover 14 is attached to the case body 12, the lower end surfaces 50a of the second ribs 50 are situated above the upper end surfaces 24a of the first ribs 24 by a distance equal to the thickness of the board 22. In other words, when the cover 14 is attached to the case body 12, the board 22 is clamped between the upper end surfaces 24a of the first ribs 24 and the lower end surfaces 50a of the second ribs 50. Second stops 50b for locating the board 22 are formed at outward locations of the cover from the lower end surfaces 50a.

Cover fastening catches (fastening members) 52 are formed at the outward sidewall 14a (outer wall) of the cover 14 at locations corresponding to the first engagement holes 36 of the case body 12. Similarly to the heat sink fastening catch 42, each cover fastening catch 52 is composed of an elastically deformable leg 52a and a projection 52b continuous therewith. The projection 52b is formed with a surface 52b2 contacted during fastening of the cover 14 to the case body 12, a surface that tangentially contacts a prescribed region (explained later) of the case body 12 at a prescribed angle after it has been fastened (hereinafter called "case body contact surface 52b1"), and a horizontal surface 52b3 (explained later) formed continuously with these surfaces and projecting in the horizontally outward direction of the case.

As best shown in FIG. 12, the sidewall 14a of the cover 14 is inclined at the same angle (3 degrees) as that at which the opening edge 18a (the sides 18a1, 18a2) of the case body 12 is inclined so that the upper surface of the cover 14 will be horizontal when the cover 14 is attached to the case body 12. Further, since the opening edge 18a of the case body 12 is formed a prescribed vertical distance toward the bottom surface side, an interior space for accommodating the board 22 is secured by extending the sidewall 14a of the cover 14 by the prescribed vertical distance in the direction of its lower edge surface 14a1.

Figure 14:
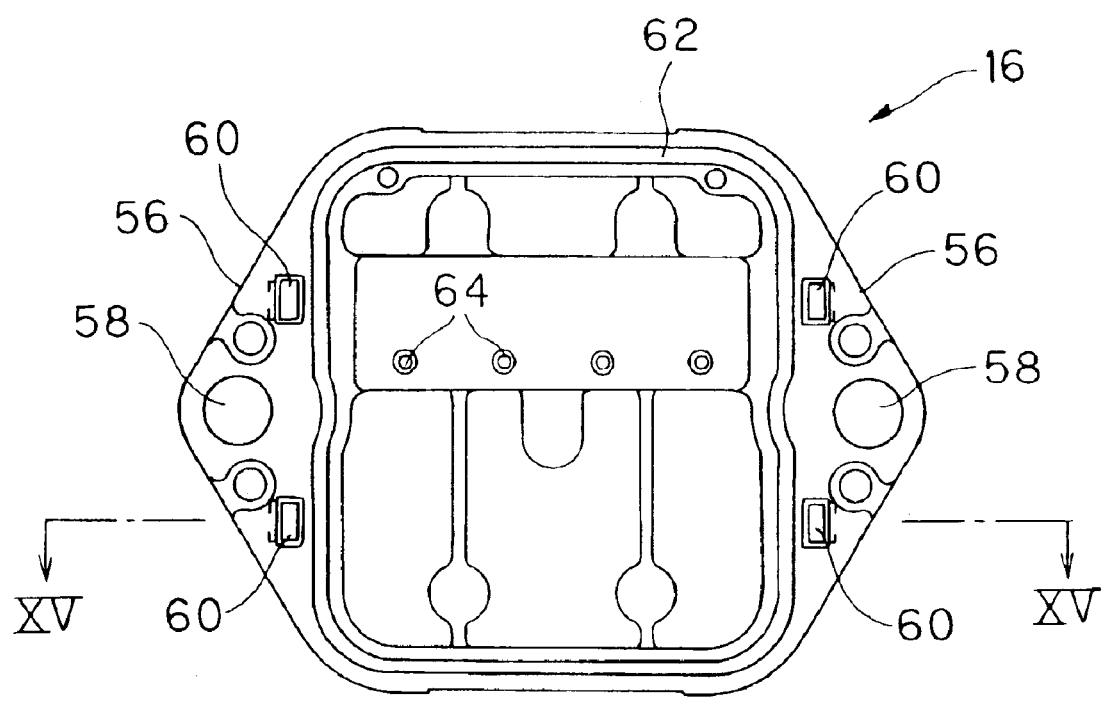
FIG. 14 is a top view of a heat sink of the case shown in FIG. 1.
Figure 15:
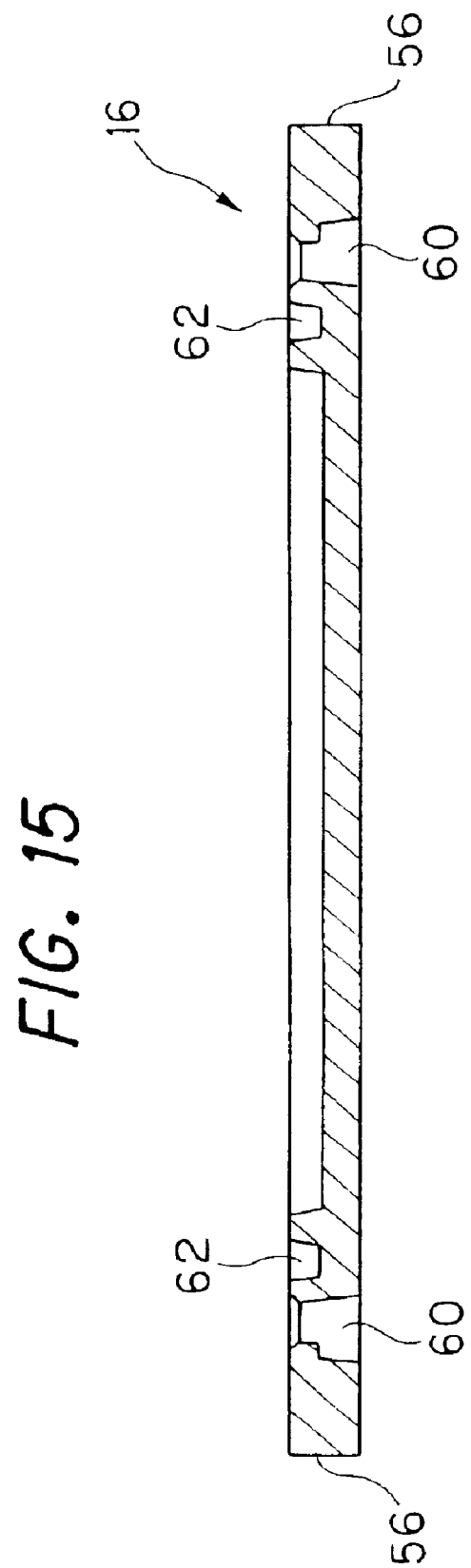
FIG. 15 is an enlarged sectional view taken along line XV—XV in FIG. 14.

FIG. 14 is a top view of the heat sink 16 and FIG. 15 is an enlarged side view thereof taken along line XV—XV in FIG. 14. The heat sink 16 will now be explained with reference to FIGS. 2, 14 and 15.

The heat sink 16 is formed to have a hexagonal shape as viewed from the top and is equipped on opposite sides with two generally triangular heat sink flanges 56. Each heat sink flange 56 is formed with a heat sink bolt hole 58 at a location corresponding to one of the bolt holes 34 of the case body 12 and is also formed with two second engagement holes 60 for receiving one of the heat sink fastening catches 42 and engaging the projection 42b.

A second annular recession 62 for receiving the first annular ridge 40 of the case body 12 is formed at a location corresponding to the first annular ridge 40. A plurality (4) bolt holes 64 for fastening electronic components are formed at appropriate locations of the heat sink 16 and, as shown in FIG. 2, heat-generating electronic components such as power transistors 66 are fastened with bolts 68.

Figure 16:
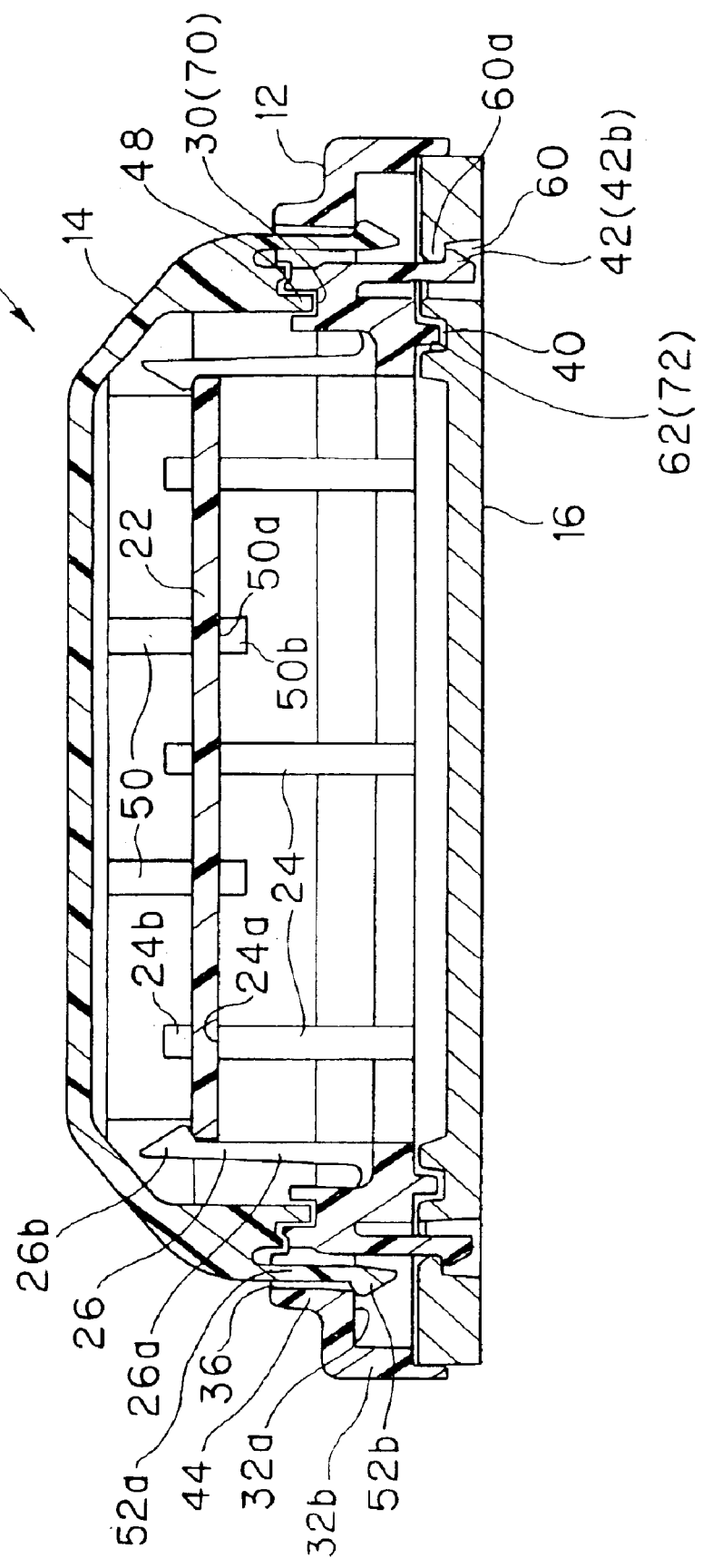
FIG. 16 is an enlarged sectional view of the case shown in FIG. 1.

FIG. 16 is a sectional view (taken at the same section as those of FIGS. 3, 4, 11 and 14) showing the fully assembled state with the board 22 housed in the case 10.

As shown in FIG. 16, the board 22 is clamped between the upper end surfaces 24a of the first ribs 24 and the projections 26b (more precisely the board contact surfaces 26b1) of the board fastening catches 26, thereby being immobilized at the prescribed location in the case 10. In addition, the cover 14 is attached to the case body 12 by engagement of the projections 52b of the cover fastening catches 52 with the first engagement holes 36, more precisely the lower surfaces 32a (the aforesaid prescribed regions) of the flanges 32.

Attachment of the cover 14 to the case body 12 further clamps the board 22 between the upper end surfaces 24a of the first ribs 24 and the lower end surfaces 50a of the second ribs 50. As a result, the board 22 is still more reliably fixed at the prescribed location.

The attachment of the heat sink 16 to the case body 12 is accomplished by engagement of the projections 42b of the heat sink fastening catches 42 formed in the case body 12 with the second engagement holes 60 formed in the heat sink 16, more precisely with the engagement portions 60a (the aforesaid prescribed regions, more precisely the corner portions thereof) formed inside the second engagement holes 60.

Figure 17:
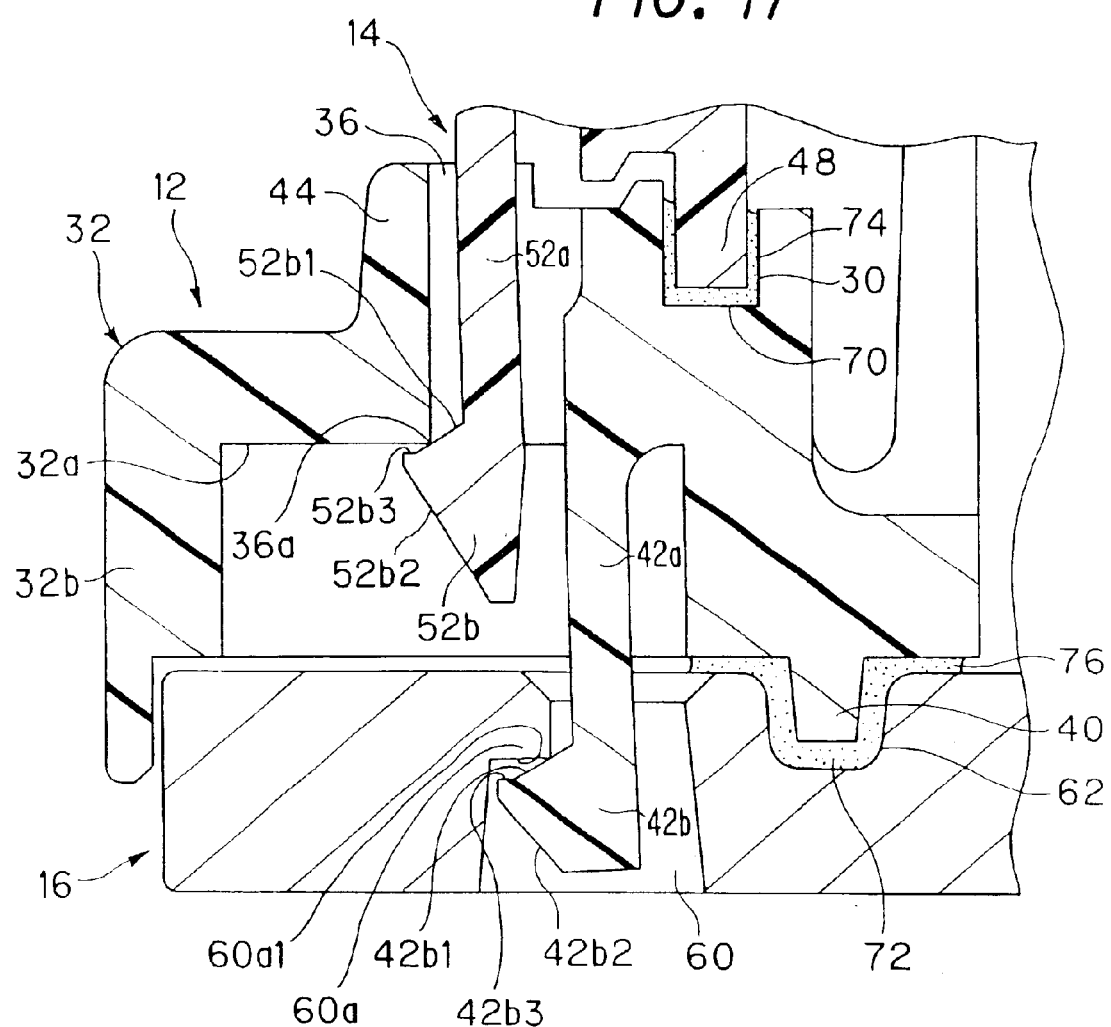
FIG. 17 is a partial enlargement of the sectional view of FIG. 16.

The attachment of the cover 14 and heat sink 16 to the case body 12 will be explained further with reference to FIG. 17. FIG. 17 is a partial enlarged view of FIG. 16.

The attachment of the cover 14 to the case body 12 will be explained first. The surfaces of the projection 52b and the case body contact surface 52b1 have basically the same shapes (dimensions and geometry) as the board fastening catches 26. The insertability at the time of inserting the cover 14 is therefore improved. In addition, molding error of the board 22, the case body 12 and the cover 14, their volumetric variation with temperature change, and variation in and thermal expansion of the thickness of the applied adhesive coating can be tolerated within the range of the lateral width and vertical width of the case body contact surface 52b1. Owing to the elasticity of the leg 52a, moreover, similar effects to those provided by the board fastening catch 26 can be obtained, including immobilization through reliable contact with the case body 12 (the first engagement hole 36).

The covers 44 will now be explained. As explained earlier, the covers 44 are formed to cover all or part of the legs 52a of the cover fastening catches 52. They therefore prevent a worker or anyone else from touching the legs 52a, i.e., from applying a force to a leg 52a in the direction of the case interior (in the direction enabling extraction of the projection 52b from the first engagement hole 36). Detachment of the cover 14 from the case body is therefore prevented.

The horizontal surface 52b3 will now be explained. The horizontal surface 52b3 is formed substantially parallel to the lower surface 32a of the flange 32. More specifically, the horizontal surface 52b3 is formed so as to lie substantially parallel to the lower surface 32a when the region of the case body contact surface 52b1 at or near the boundary between it and the horizontal surface 52b3 contacts the lower surface 32a of the flange 32. Therefore, when very strong vibration or thermal shock acting on the leg 52a of the cover fastening catch 52 deforms the leg 52a toward the case interior (in the direction enabling extraction of the projection 52b from the first engagement holes 36), the projection 52b is prevented from leaving the first engagement hole 36 and the cover 14 from detaching from the case body 12 because the horizontal surface 52b3 catches on the corner portion 36a of the first engagement hole 36. In other words, the tangent between the first engagement hole 36, more precisely the lower surface 32a of the flange 32 continuous therewith, and the case body contact surface 52b1 is prevented from leaving the range of the case body contact surface 52b1, meaning that the engaged state is not released. Detachment of the cover 14 from the case body 12 is therefore prevented.

Further, the second annular ridge 48 formed on the cover 14 fits into the first annular recession 30 formed on the case body 12, and thermosetting adhesive 74 applied beforehand to the first annular recession 30 spreads through a first gap 70 formed between the first annular recession 30 and the second annular ridge 48. This enhances the strength and watertightness of the case 10.

Since the engagement of the cover fastening catches 52 and the first engagement holes 36 fixes the case body 12 and the cover 14 together, no jig is required while the adhesive 74 is setting. The adhesive 74 need not be used when the degree of strength and watertightness required is not particularly high.

The attachment of the heat sink 16 to the case body 12 will now be explained. The heat sink fastening catches 42 have basically the same shape as the cover fastening catches 52. They therefore will not be explained further, other than to say that the horizontal surface 42b3 is formed parallel to the lower surface 60a1 of the engagement portion 60a. Effects like those explained with regard to the cover fastening catches 52 can also be enjoyed regarding the engagement between the heat sink fastening catches 42 and the second engagement holes 60.

Further, thermosetting adhesive 76 applied beforehand to the second annular recession 62 formed in the heat sink 16 spreads through a second gap 72 formed between the second annular recession 62 and the first annular ridge 40. This enhances the strength and watertightness of the case 10.

Since the engagement of the heat sink fastening catches 42 and the second engagement holes 60 fixes the case body 12 and the heat sink 16 together, no jig is required while the adhesive 76 is setting. The adhesive 76 need not be used when the degree of strength and watertightness required is not particularly high.

Moreover, the legs 42a of the heat sink fastening catches 42 are formed on the side wall lower surfaces 32a of the case body 12, i.e., farther toward the case interior than the side wall 32b of the flanges 32. Since this prevents someone such as a worker from touching the leg 42a, it prevents detachment of the heat sink 16 from the case body 12.

The engagement portions 60a engaged by the projections 42b are formed inside the second engagement holes 60 formed in the heat sink 16. In other words, they are formed inside the space defined by the external shape of the sink 16 at locations continuous with the external space. The heat sink 16 can therefore be prevented from separating from the case body 12 while enabling its detachment by finger-operation of the projections 42b whenever required.

The finished case 10 is installed at the desired location, such as in a vehicle engine compartment, by passing bolts (not shown) through the bolt holes 34 formed in the flanges 32 of the case body 12 and the heat sink bolt holes 58 formed in the heat sink flanges 56 of the heat sink 16. In the case of installation in an engine compartment, it is preferable to enhance the strength and watertightness of the assembly not only by fastening the assembled heat sink 16, case body 12 and cover 14 by engaging the catches as explained in the foregoing but also by bonding them together with adhesive. On the other hand, when installing the case 10 in a relatively moderate environment, such as in a vehicle passenger compartment, adequate reliability can be obtained even if the assembled heat sink 16, case body 12 and cover 14 are fastened together only by engaging the catches.

Figure 18:
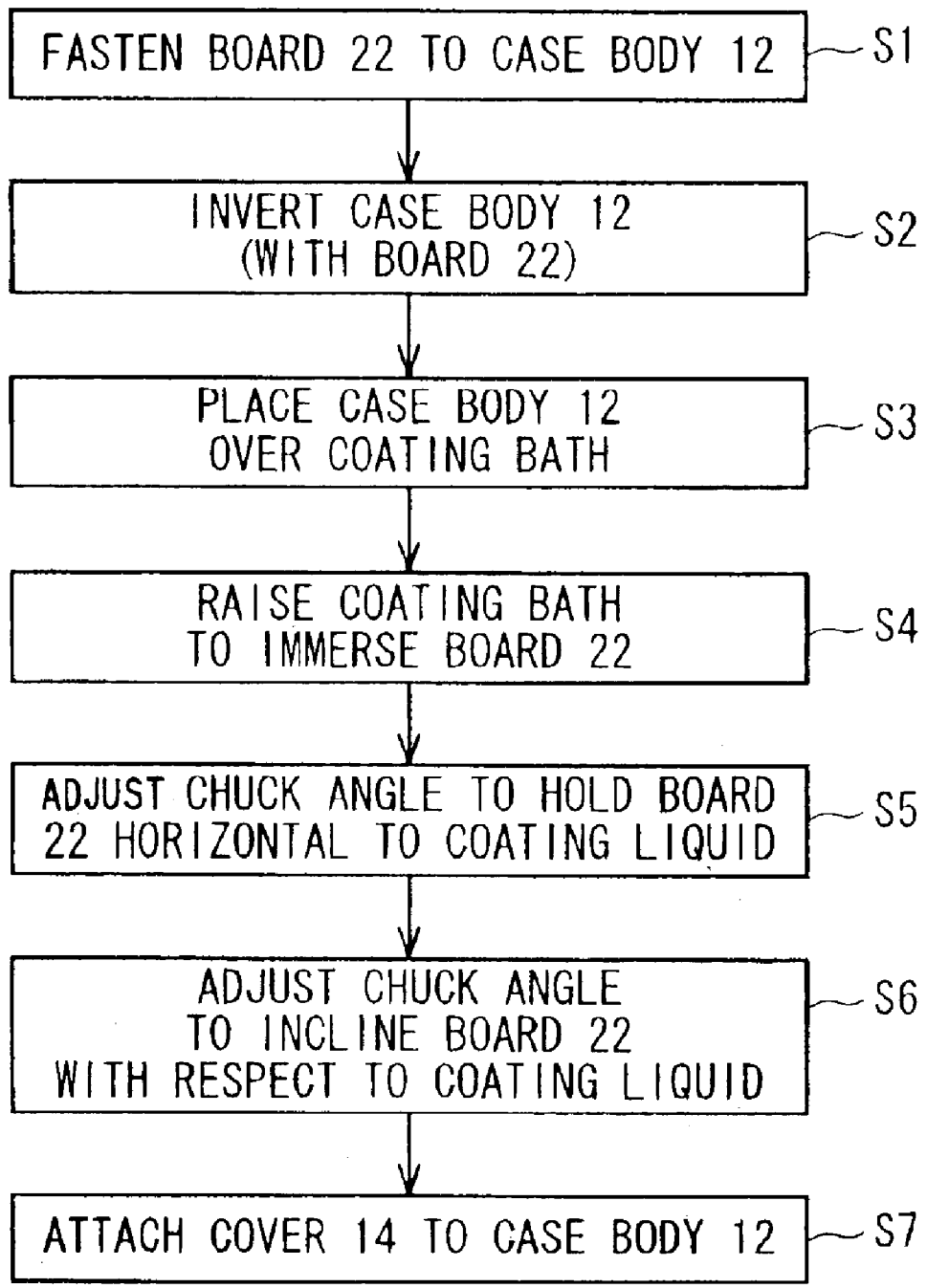
FIG. 18 is flow chart showing a method of producing the electronic circuit unit of this embodiment.

A method of producing an electronic circuit unit utilizing the case 10 will now be explained with reference to FIGS. 18–24. FIG. 18 is a flow chart showing the production method of this embodiment, and FIGS. 19–24 are side views showing the electronic circuit unit in different steps of the method.

Figure 19:
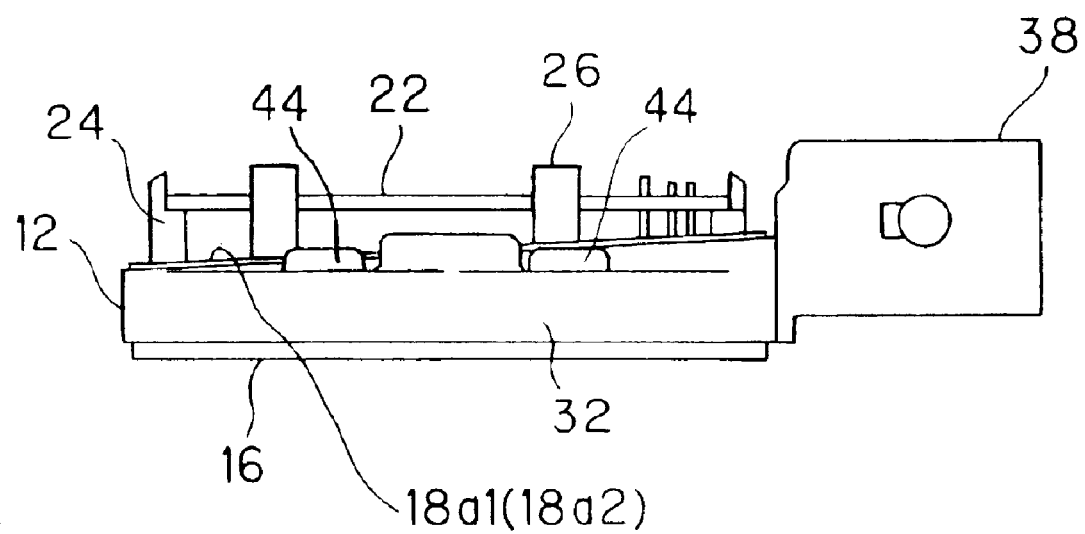
FIG. 19 is a side view showing the electronic circuit unit is step (S1) of the flow chart shown in FIG. 18.

As shown in the flow chart of FIG. 18, first, in S1, the board 22 having components mounted thereon beforehand by reflow soldering is fastened to the case body 12, the heat sink 16 is fastened to the case body 12, and the leads of power transistors bolted on the heat sink 16 and the leads of the connector 38 are soldered to the board 22 (see FIG. 19).

Figure 20:
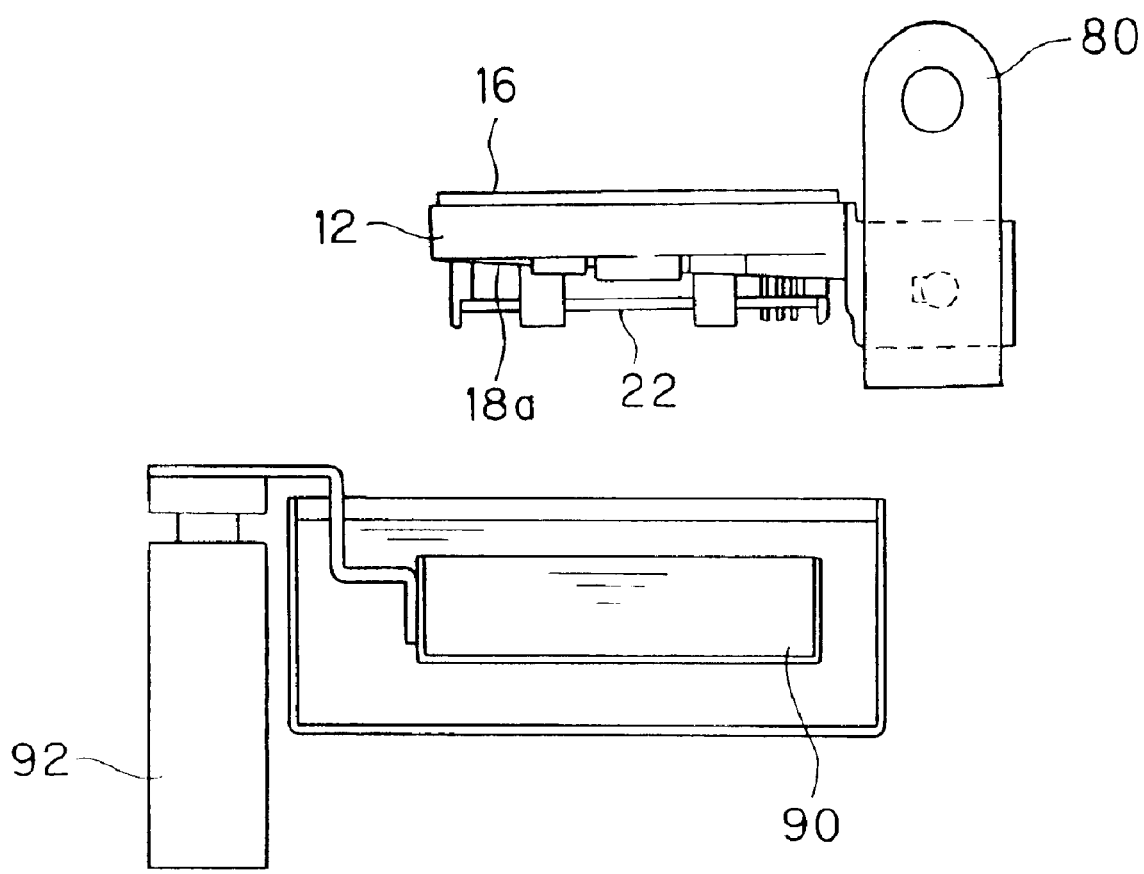
FIG. 20 is

Next, in S2, the case body 12 with the board 22 and heat sink 16 attached is inverted, whereafter, in S3, the connector 38 is gripped by a chuck 80 (holding means) to place the case body 12 etc. over a rising coating bath (see FIG. 20).

Figure 21:
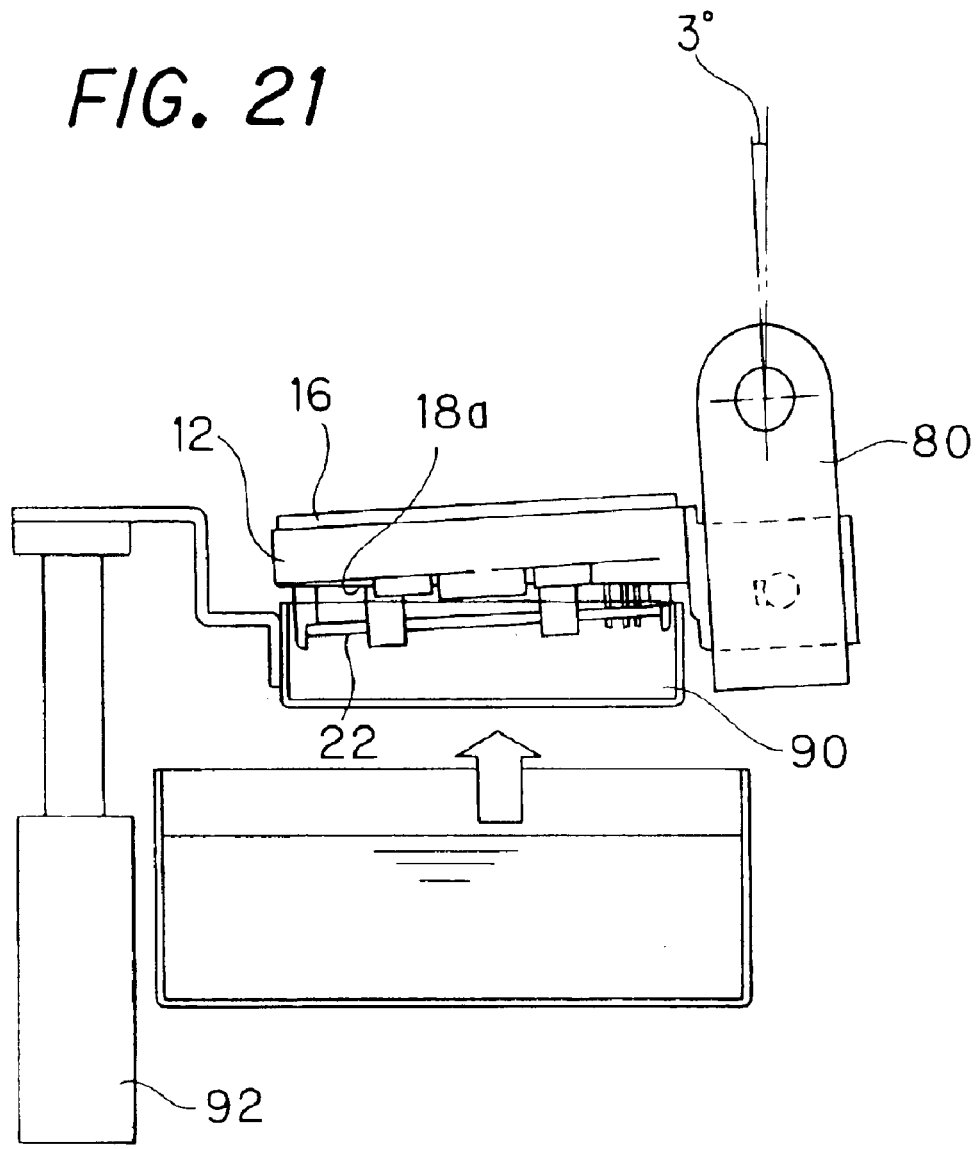
FIG. 21 is a side view showing the electronic circuit unit in step (S4) of the flow chart shown in FIG. 18.

Next, in S4, the angle of the chuck is adjusted to incline the axis of the connector 38 at a prescribed angle (3 degrees, the same as the angle at which the opening edge 18a is inclined), while a coating bath 90 is simultaneously raised by an appropriate actuator 92 to fully immerse the board 22 in a coating liquid (see FIG. 21).

At this time, the coating bath 90 rises to near the opening edge 18a but no coating liquid is applied to the opening edge 18a because the upper end surfaces 24a of the first ribs 24 that collectively constitute the mounting surface for the board 22 are formed a predetermined vertical distance above the opening edge 18a defining the first opening 18 (below the opening edge 18a in the inverted state shown in FIG. 21) and the opening edge 18a is oriented horizontal to the coating liquid (so that the opening edge 18a makes a prescribed angle). The board 22 can therefore be completely immersed in the coating liquid. Nor is any coating liquid applied to the connector 38 because it is located on the outer side relative to the coating bath 90 (the side not immersed). Moreover, the coating liquid readily flows over all surfaces of the board 22 because the board 22 is dipped into the coating liquid in an inclined state.

Figure 22:
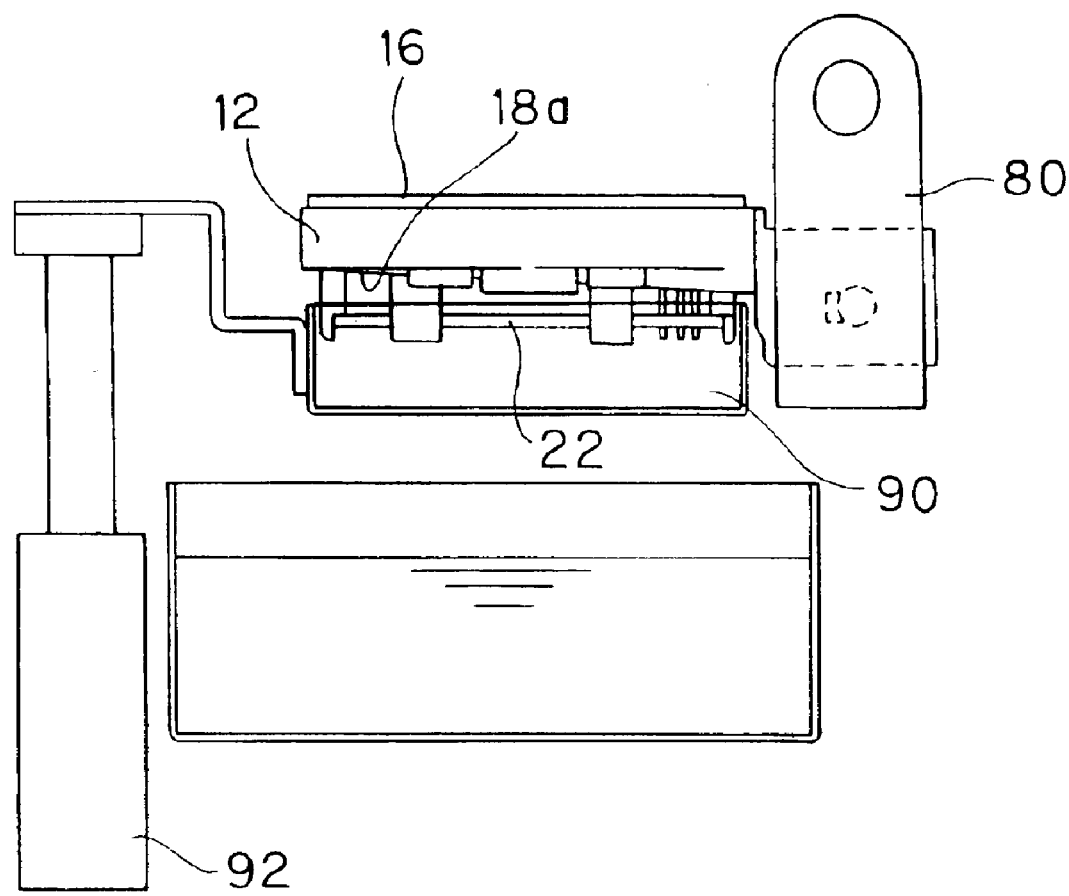
FIG. 22 is a side view showing the electronic circuit unit in step (S5) of the flow chart shown in FIG. 18.

Next, in S5, as shown in FIG. 22, after the coating bath 90 has come close to the opening edge 18A, the angle of the chuck 80 is adjusted to change the orientation of the axis of the connector 38 so as to hold (position) the board 22 horizontal (parallel) to the coating liquid.

At this time, as in S4, no coating liquid is applied to the opening edge 18a because the opening edge 18a is located above the board 22. Moreover, the holding of the board 22 in the horizontal orientation enables the coating liquid to run across the whole surface area of the board.

Figure 23:
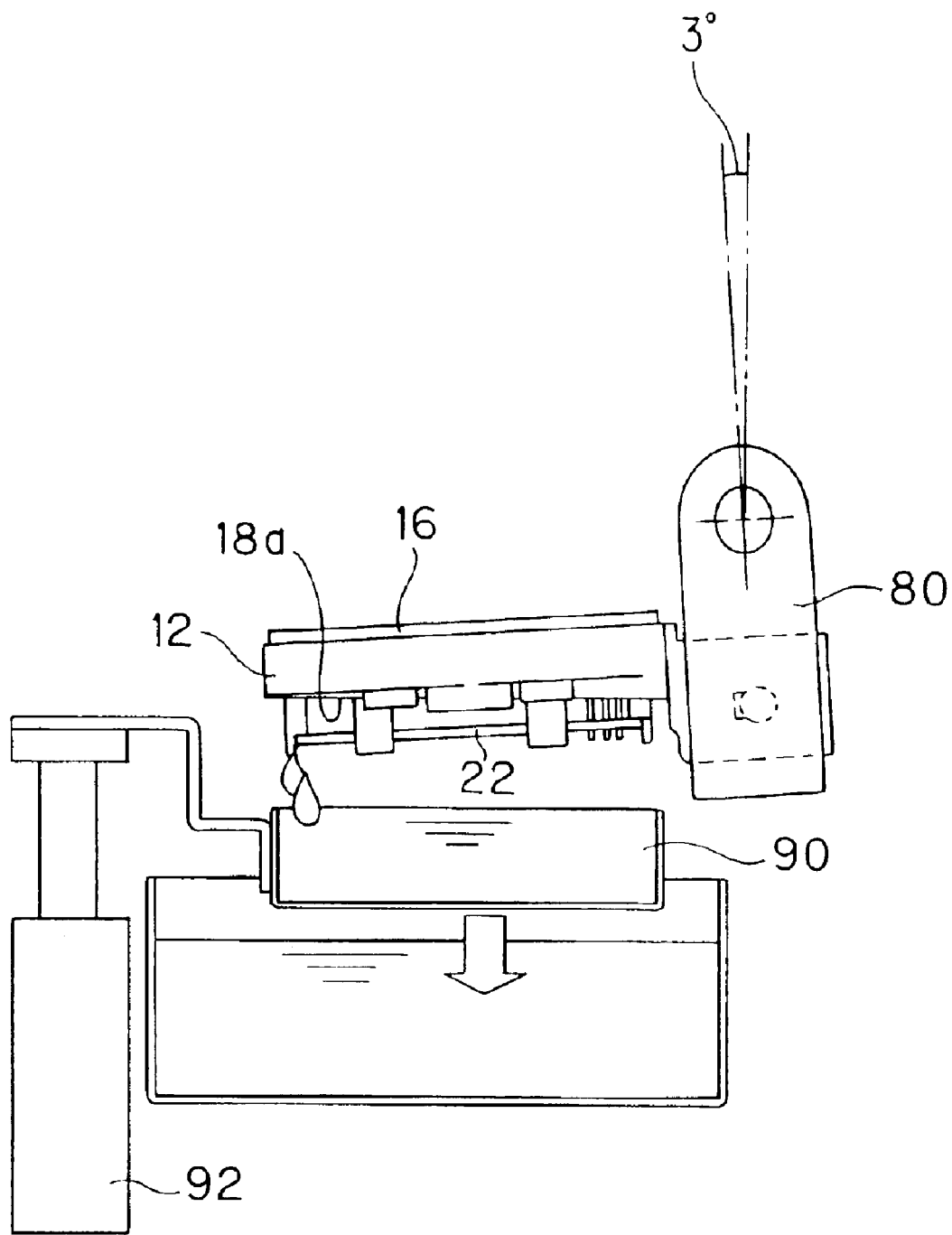
FIG. 23 is a side view showing the electronic circuit unit is step (S6) of the flow chart shown in FIG. 18.

Next, in S6, as shown in FIG. 23, as the coating bath 90 is lowered, the angle of the chuck is adjusted to change the orientation of the axis of the connector 38 so as to incline the board 22 by the prescribed angle (3 degrees) with respect to the coating liquid.

At this time, excess coating liquid applied to the board 22 runs off and and the thickness of coating becomes uniform.

Figure 24:
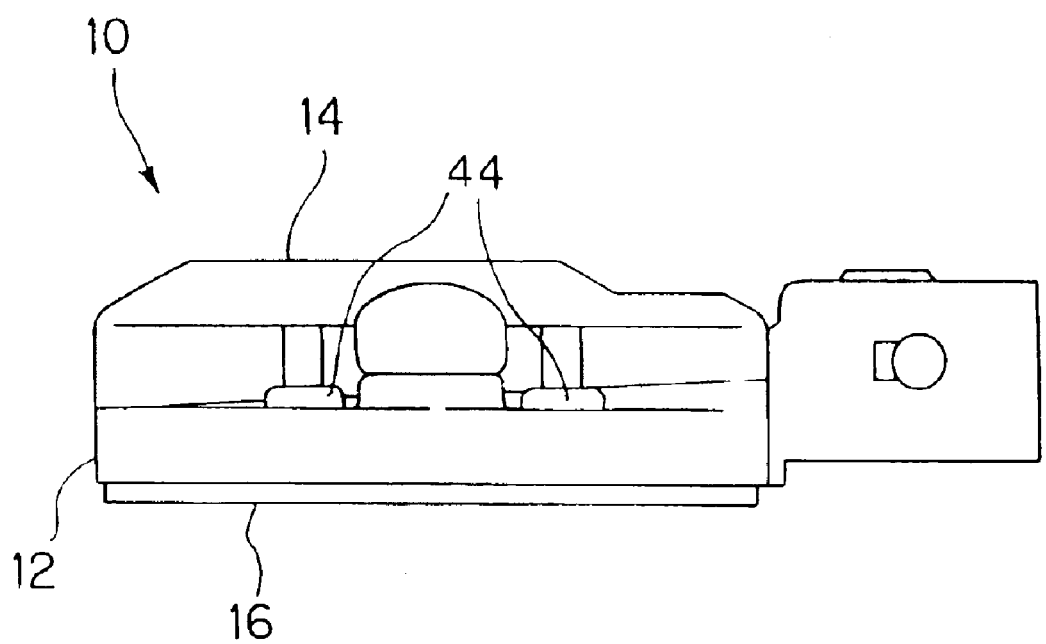
FIG. 24 is a side view showing the finished electronic circuit unit is step (S7) of the flow chart shown in FIG. 18.

After the coating has been completed by conducting the foregoing steps, next, in S7, the cover 14 is attached to the case body 12 to obtain the finished electronic circuit unit utilizing a case 10 shown in FIG. 24.

In the production method of this embodiment, since the connector 38 can be held by the chuck after the board 22 has been attached to the case body 12, no jig is required. Nor is masking required. The fabrication process can therefore be prevented from becoming complicated. In addition, the reliability of the electronic circuit unit can be enhanced because entire board 22 can be evenly applied with the coating liquid.

The embodiment is thus configured to have a case (10) for housing an electronic circuit board (22), including; a case body (12) formed with an opening (first opening 18) at least at an upper surface for accommodating the electronic circuit board (22) and with a mount (first rib 24) having a mounting surface (upper end surface 24a) for mounting the electronic circuit board; and fastening means (board fastening catch 26) for fastening the electronic circuit board on the mount, wherein the improvement comprises: the opening (18) is configured such that whose edge (opening edge 18a) is formed a prescribed distance below the mounting surface (24a).

More specifically, it is configured to have a case for housing an electronic circuit board (22) having a case body (12) formed with a mount (24) having a mounting surface (24a(for mounting at least an electronic circuit board (22); fastening means (26) for fastening the electronic circuit board on the mount; and a cover (14) attachable to the case body with a lower edge surface of a side wall (14a1)of the cover in contact with an upper edge surface (18a) of a side wall (12a) of the case body, the case for housing the electronic circuit board being adapted to house the electronic circuit board in an internal space formed between the case body and the cover to be fastened on the mount by the fastening means, wherein the upper edge surface (18a) of a side wall of the case body (i.e., the edge defining the opening) is formed at a prescribed distance below a mounting surface (24a) of the mount (24) and the side wall (14a) of the cover (14) is extended the prescribed distance toward the lower edge surface (14a1) of the side wall, thereby securing the internal space for housing electronic circuit board.

In the case, the prescribed distance is determined to a height such that when the electronic circuit board (22) is fixed on the mount (24) of the case body (12) is inverted and dipped into the coating liquid for full coating, the coating liquid is not applied to a prescribed region (opening edge 18a, etc.) of the case body (12).

In the case, a connecter (38) for connection with external devices is integrally formed with the case body (12) to constitute a portion of the prescribed region not applied with the coating liquid.

In the case, the edge (18a) of the opening (18) is formed such that two opposed sides (18a1, 18a2) of the opening edge form a prescribed angle (e.g., 3 degrees) relative to the mounting surface (24a).

The embodiment is also configured to have a method of producing an electronic circuit unit including the case (10) for housing an electronic circuit board (22) recited in any of claims 1 to 4, comprising the steps of: fastening at least the electronic circuit board (22) on the mount (24) of the case body (12) with the fastening means (board fastening catch 26) (S1); inverting the case body (12) in which the electronic circuit board (22) is fixed (S2); placing the inverted case body (12) over a rising coating bath (90) line (S3); and raising the coating bath (90) close to the edge (18a) of the opening (18) such that the electronic circuit board (22) is dipped in the coating liquid (S4).

The embodiment is also configured to have a method of producing a method of producing an electronic circuit unit including the case (10) for housing an electronic circuit board (22) recited in claim 4, comprising the steps of: fastening at least the electronic circuit board (22) on the mount (24) of the case body (12) with the fastening means (board fastening catch 26) (S1); inverting the case body (12) in which the electronic circuit board (22) is fixed (S2); placing the inverted case body (12) over a rising coating bath (90) line with the connector(38) held by an angularly adjustable holding means (chuck 80)(S3); adjusting an angle of the holding means (chuck 80) to incline the electronic circuit board (22) at the prescribed angle (e.g., 3 degrees) with respect to the coating liquid surface (S4); raising the coating bath (90) close to the edge (18a) of the opening (18)

such that the electronic circuit board (22) is dipped in the coating liquid (S4); adjusting the angle of the holding means (chuck 80) such that the electronic circuit board (22) is positioned horizontal with respect to the coating liquid surface (S5); and adjusting the angle of the holding means (chuck 80) such that the electronic circuit board (22) is inclined at the prescribed angle with respect to the coating liquid, while lowering the coating bath (90)(S6).

The entire disclosure of Japanese Patent Application No. 2002-028964 filed on Feb. 6, 2002, including specification, claims, drawings and summary, is incorporated herein in its entirety.

While the invention has thus been shown and described with reference to specific embodiments, it should be noted that the invention is in no way limited to the details of the described arrangements; changes and modifications may be made without departing from the scope of the appended claims.

What is claimed is:

1. A case for housing an electronic circuit board, comprising:
    a case body having an opening formed at an upper surface for accommodating the electronic circuit board and including a mount having a mounting surface for mounting the electronic circuit board; and
    fastening means for fastening the electronic circuit board on the mount,
    wherein the opening includes an edge having two sides opposed to each other with the electronic circuit board situated therebetween, the two sides of the edge lie in a first plane and the mounting surface lies in a second plane, wherein the edge is at least a prescribed distance below the mounting surface, and the first plane forms a prescribed angle relative to the second plane, and wherein the prescribed angle is not 0°.

2. A case according to claim 1, wherein the prescribed distance is determined to a height such that when the electronic circuit board is fixed on the mount of the case body and is inverted and dipped into a coating liquid for full coating, the coating liquid is not applied to a coating prohibited region of the case body.

3. A case according to claim 2, wherein a connecter for connection with external devices is integrally formed with the case body to constitute a portion of the coating prohibited region not applied with the coating liquid.

4. A method of producing an electronic circuit unit including the case for housing an electronic circuit board recited in any of claims 1 to 3, comprising the steps of:
    fastening at least the electronic circuit board on the mount of the case body with the fastening means;
    inverting the case body in which the electronic circuit board is fixed;
    placing the inverted case body over a rising coating bath line; and
    raising the coating bath close to the edge of the opening such that the electronic circuit board is dipped in the coating liquid.

5. A method of producing an electronic circuit unit including the case for housing an electronic circuit board recited in claim 1, comprising the steps of:
    fastening at least the electronic circuit board on the mount of the case body with the fastening means;
    inverting the case body in which the electronic circuit board is fixed;
    placing the inverted case body over a rising coating bath line with the connector held by an angularly adjustable holding means;
    adjusting an angle of the holding means to incline the electronic circuit board at the prescribed angle with respect to the coating liquid surface;
    raising the coating bath close to the edge of the opening such that the electronic circuit board is dipped in the coating liquid;
    adjusting the angle of the holding means such that the electronic circuit board is positioned horizontal with respect to the coating liquid surface; and
    adjusting the angle of the holding means such that the electronic circuit board is inclined at the prescribed angle with respect to the coating liquid, while lowering the coating bath.

* * * * *